(12) United States Patent
Takeuchi

(10) Patent No.: US 8,704,309 B2
(45) Date of Patent: Apr. 22, 2014

(54) DISPLAY PANEL AND METHOD OF MANUFACTURING THE SAME

(75) Inventor: Takayuki Takeuchi, Osaka (JP)

(73) Assignee: Panasonic Corporation, Osaka (JP)

( * ) Notice: Subject to any disclaimer, the term of this patent is extended or adjusted under 35 U.S.C. 154(b) by 40 days.

(21) Appl. No.: 13/352,921

(22) Filed: Jan. 18, 2012

(65) Prior Publication Data

US 2012/0299021 A1 Nov. 29, 2012

Related U.S. Application Data

(63) Continuation of application No. PCT/JP2011/002952, filed on May 26, 2011.

(51) Int. Cl.
| | |
|---|---|
| H01L 23/62 | (2006.01) |
| H01L 31/00 | (2006.01) |
| H01L 29/10 | (2006.01) |
| H01L 29/04 | (2006.01) |
| H01L 21/00 | (2006.01) |
| H01L 21/84 | (2006.01) |

(52) U.S. Cl.
USPC .............. 257/359; 257/59; 257/88; 438/149; 438/151

(58) Field of Classification Search
USPC .......... 257/88, 149, 347, 59, 359; 438/34, 14, 438/149, 283, 30, 151
See application file for complete search history.

(56) References Cited

U.S. PATENT DOCUMENTS

| | | | |
|---|---|---|---|
| 4,877,174 | A | 10/1989 | Bruhn |
| 5,151,807 | A | 9/1992 | Katayama et al. |
| 5,343,216 | A | 8/1994 | Katayama et al. |
| 5,443,922 | A | 8/1995 | Nishizaki et al. |
| 5,469,025 | A | 11/1995 | Kanemori et al. |
| 5,508,591 | A | 4/1996 | Kanemori et al. |
| 6,259,424 | B1 | 7/2001 | Kurogane |

(Continued)

FOREIGN PATENT DOCUMENTS

| | | |
|---|---|---|
| JP | 63-276032 | 11/1988 |
| JP | 64-48038 | 2/1989 |

(Continued)

OTHER PUBLICATIONS

International Search Report of PCT/JP2011/002956, dated Jun. 28, 2011.

(Continued)

*Primary Examiner* — George Fourson, III
*Assistant Examiner* — Wilner Jean Baptiste
(74) *Attorney, Agent, or Firm* — Greenblum & Bernstein, P.L.C.

(57) ABSTRACT

Drive units arranged on a transistor array substrate include faulty drive units. The pixel electrodes include first pixel electrodes and second pixel electrodes, the first pixel electrodes corresponding one-to-one to the faulty drive units, and the second pixel electrodes corresponding one-to-one to the non-faulty drive units, a portion of each second pixel electrode is embedded in the contact hole corresponding thereto, and is in contact with a power supply pad of the non-faulty drive unit corresponding thereto, so that the second pixel electrode is electrically connected to the non-faulty drive unit. Each first pixel electrode is electrically insulated from the faulty drive unit corresponding thereto, and is connected by a connector to any of the second pixel electrodes adjacent thereto. A surface of each connector facing the interlayer insulation film is entirely in contact with the interlayer insulation film.

13 Claims, 24 Drawing Sheets

(56) References Cited

U.S. PATENT DOCUMENTS

| | | |
|---|---|---|
| 6,833,560 B2 | 12/2004 | Konuma et al. |
| 7,554,119 B2 | 6/2009 | Sawamizu et al. |
| 2001/0050730 A1 | 12/2001 | Tsukao |
| 2005/0077517 A1* | 4/2005 | Chang et al. .............. 257/59 |
| 2007/0126460 A1 | 6/2007 | Chung et al. |
| 2007/0252146 A1 | 11/2007 | Yokomizo |
| 2008/0239219 A1 | 10/2008 | Nagano et al. |
| 2010/0078640 A1 | 4/2010 | Mei et al. |

FOREIGN PATENT DOCUMENTS

| | | |
|---|---|---|
| JP | 2-185046 | 7/1990 |
| JP | 2-203389 | 8/1990 |
| JP | 2-223928 | 9/1990 |
| JP | 2-262125 | 10/1990 |
| JP | 4-265946 | 9/1992 |
| JP | 05-163488 | 6/1993 |
| JP | 9-5785 | 1/1997 |
| JP | 9-5786 | 1/1997 |
| JP | 11-72805 | 3/1999 |
| JP | 2001-356364 | 12/2001 |
| JP | 2002-131779 | 5/2002 |
| JP | 2007-72116 | 3/2007 |
| JP | 2007-156407 | 6/2007 |
| JP | 2007-241183 | 9/2007 |
| JP | 2007-298791 | 11/2007 |
| JP | 2008-241821 | 10/2008 |
| JP | 2008-262013 | 10/2008 |
| JP | 2010-145875 | 7/2010 |
| JP | 2010-249883 | 11/2010 |

OTHER PUBLICATIONS

International Search Report of PCT/JP2011/002952, dated Jun. 28, 2011.

U.S.A.(U.S. Appl. No. 13/292,546) Office action, mail date is Mar. 14, 2013.

* cited by examiner

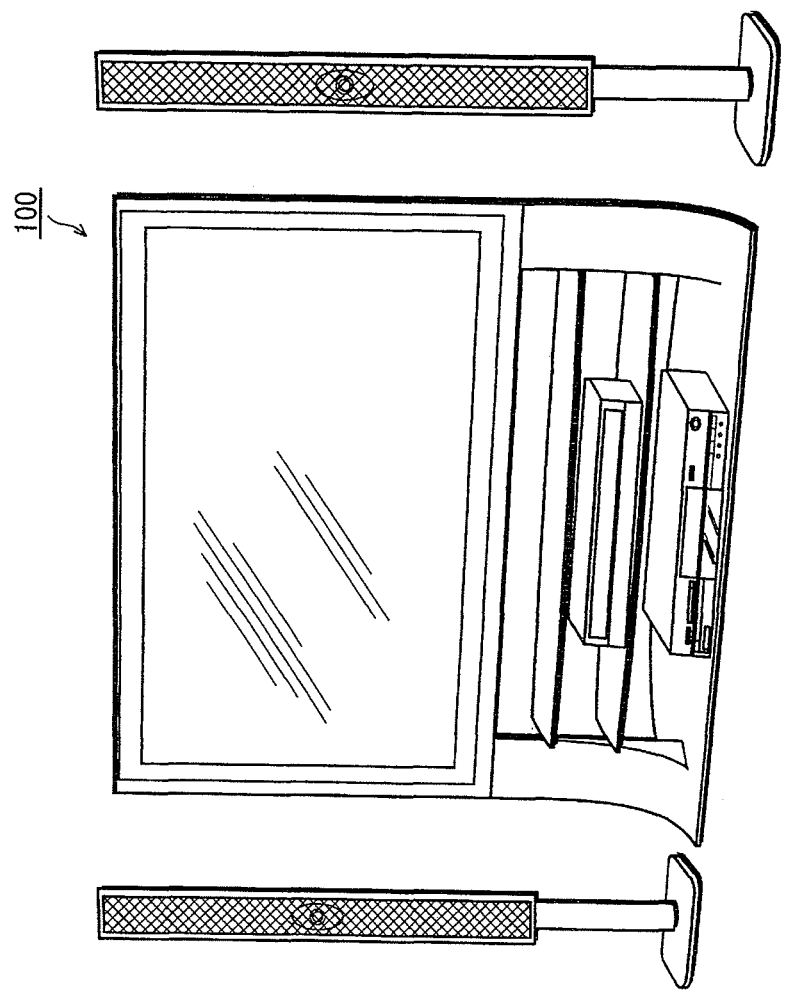

DISPLAY PANEL AND METHOD OF MANUFACTURING THE SAME

CROSS REFERENCE TO RELATED APPLICATION

This is a continuation application of PCT Application No. PCT/JP2011/002952 filed May 26, 2011, designating the United States of America, the disclosure of which, including the specification, drawings and claims, is incorporated herein by reference in its entirety.

TECHNICAL FIELD

The present invention relates to an active-matrix display panel and a method of manufacturing the same.

BACKGROUND ART

In a display panel of this type, a drive unit is provided for each pixel electrode arranged in a matrix. Each drive unit includes a thin-film transistor element. It is ideal that all the thin-film transistor elements of the drive units operate properly. In reality, however, some of the thin-film transistor elements are faulty due to poor pressure endurance of gate insulation films, breaking of wiring lines, or the likes. When a pixel electrode is driven by a drive unit including a faulty thin-film transistor element, a dark dot or a bright dot could occur in the display panel. For this reason, Patent Literature 1 discloses a technology to prevent the faulty drive unit and the pixel electrode corresponding to the faulty drive unit from electrically connecting with each other, and the pixel electrode is electrically connected to another pixel electrode corresponding to a non-faulty drive unit.

More specifically, according to the Patent Literature 1, a plurality of pixel electrodes are arranged on a substrate in a matrix, and gate signal lines and source signal lines are formed in the row direction and the column direction respectively to connect adjacent pixel electrodes. Consequently, the pixel electrodes and the signal lines exist on the same layer, and either a gate signal line or a source signal line exists between adjacent pixel electrodes. In order to connect adjacent pixel electrodes, the signal lines are coated with an insulative film to prevent short circuit, and the adjacent pixel electrodes are connected via a metal thin film.

With the stated structure, a pixel electrode corresponding to a faulty drive unit is driven by a non-faulty drive unit electrically connected to the pixel electrode. This prevents occurrence of dark dots and bright dots on the display panel.

CITATION LIST

Patent Literature

[Patent Literature 1] Japanese Patent Application Publication No. 63-276032

SUMMARY OF INVENTION

Technical Problem

Considering the prevention of short circuit, it is preferable that the insulative film coating the signal line is relatively thick. This is because if the insulative film is a thin film, pin holes, cracks or the likes are likely to occur in the insulative film, and short circuit might occur between the metal thin film formed on the insulative film and the signal lines, even when the signal lines are coated with the insulative film. If short circuit occurs, it becomes impossible to properly drive pixel electrodes corresponding to non-faulty drive units. This enlarges an faulty area on the display panel, and further degrades the image quality.

On the other hand, if the insulative film is too thick, the metal thin film is likely to break due to the large difference in height between the substrate and the insulative film. This is because the metal thin film is formed by sputtering or the like and a large difference in height between the substrate and the metal thin film renders it difficult to coat the side surfaces of the insulative film. If a break occurs, the adjacent pixel electrodes will not be electrically connected to each other, and the image quality will not be improved.

In view of the problem above, the present invention aims to provide a display panel that is capable of preventing occurrence of breaks in the connector between adjacent pixel electrodes.

Solution to Problem

To achieve the aim, one aspect of the present invention is a display panel comprising: a transistor array substrate having a plurality of drive units arranged in a matrix, each drive unit including a thin-film transistor element; an interlayer insulation film formed on the transistor array substrate and having contact holes, the contact holes corresponding one-to-one to the drive units; and a plurality of pixel electrodes arranged on the interlayer insulation film in a matrix, the pixel electrodes corresponding one-to-one to the drive units, wherein the drive units include faulty drive units and non-faulty drive units, the pixel electrodes include first pixel electrodes and second pixel electrodes, the first pixel electrodes corresponding one-to-one to the faulty drive units, and the second pixel electrodes corresponding one-to-one to the non-faulty drive units, a portion of each second pixel electrode is embedded in the contact hole corresponding thereto, and is in contact with a power supply pad of the non-faulty drive unit corresponding thereto, so that the second pixel electrode is electrically connected to the non-faulty drive unit, each first pixel electrode is electrically insulated from the faulty drive unit corresponding thereto, each first pixel electrode is connected by a connector to any of the second pixel electrodes adjacent thereto, the connector being made of conductive material, and a surface of each connector facing the interlayer insulation film is entirely in contact with the interlayer insulation film.

Advantageous Effects of Invention

In the display panel pertaining to one aspect of the present invention, each first pixel electrode is connected to any of the second pixel electrodes adjacent thereto, and the surface of each connector facing the interlayer insulation film is entirely in contact with the interlayer insulation film. In other words, the area on the interlayer insulation film between the first pixel electrode and the adjacent second pixel electrode, where the connector is formed, is flat. The connector is therefore unlikely to break.

Moreover, each first pixel electrode is driven by the non-faulty drive unit corresponding to the second pixel electrode connected by the connector to the first electrode, which prevents occurrence of dark dots and bright dots on the display panel. Thus, degradation of the image quality due to bright dots and dark dots is prevented.

BRIEF DESCRIPTION OF DRAWINGS

FIG. 24 shows an external view of the display device 100.

DESCRIPTION OF EMBODIMENTS

Aspects

Figure 1A:
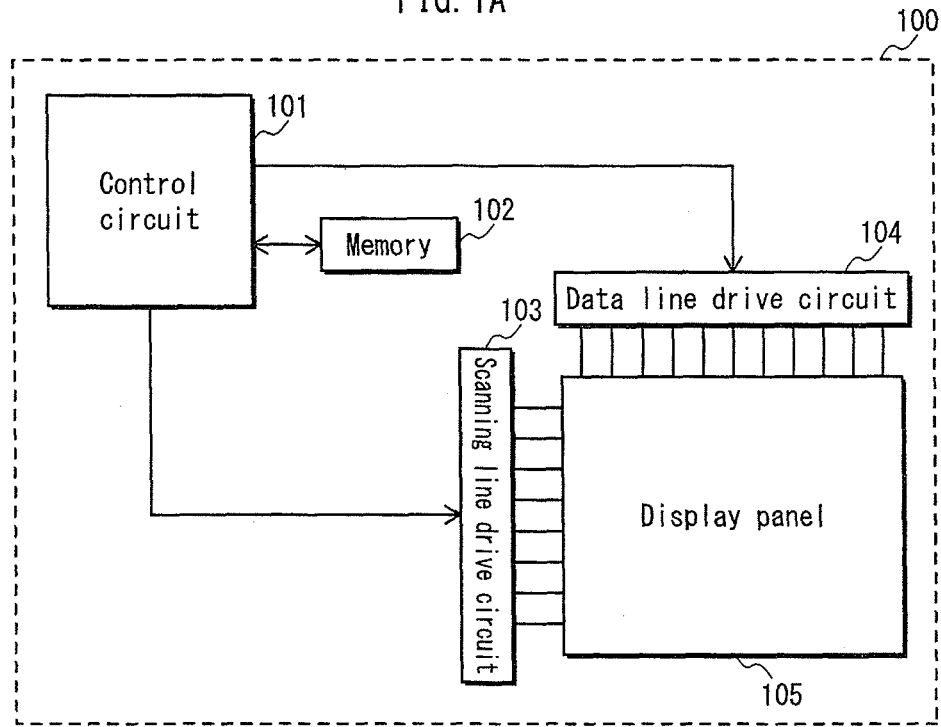
FIG. 1A is a block diagram showing an electrical structure of a display device 100 including a display panel 105 pertaining to Embodiment 1 of the present invention.

A display panel as one aspect of the present invention is a display panel comprising: a transistor array substrate having a plurality of drive units arranged in a matrix, each drive unit including a thin-film transistor element; an interlayer insulation film formed on the transistor array substrate and having contact holes, the contact holes corresponding one-to-one to the drive units; and a plurality of pixel electrodes arranged on the interlayer insulation film in a matrix, the pixel electrodes corresponding one-to-one to the drive units, wherein the drive units include faulty drive units and non-faulty drive units, the pixel electrodes include first pixel electrodes and second pixel electrodes, the first pixel electrodes corresponding one-to-one to the faulty drive units, and the second pixel electrodes corresponding one-to-one to the non-faulty drive units, a portion of each second pixel electrode is embedded in the contact hole corresponding thereto, and is in contact with a power supply pad of the non-faulty drive unit corresponding thereto, so that the second pixel electrode is electrically connected to the non-faulty drive unit, each first pixel electrode is electrically insulated from the faulty drive unit corresponding thereto, each first pixel electrode is connected by a connector to any of the second pixel electrodes adjacent thereto, the connector being made of conductive material, and a surface of each connector facing the interlayer insulation film is entirely in contact with the interlayer insulation film.

In the above-described display panel, each first pixel electrode is connected to any of the second pixel electrodes adjacent thereto, and the surface of each connector facing the interlayer insulation film is entirely in contact with the interlayer insulation film. In other words, the area on the interlayer insulation film between the first pixel electrode and the adjacent second pixel electrode, where the connector is formed, is flat. The connector is therefore unlikely to break.

Moreover, each first pixel electrode is driven by the non-faulty drive unit corresponding to the second pixel electrode connected by the connector to the first electrode, which prevents occurrence of dark dots and bright dots on the display panel. Thus, degradation of the image quality due to bright dot and dark dot is prevented.

In the display panel, the pixel electrodes and the connectors may be made of a same material, and the first pixel electrodes, the second pixel electrodes, and the connectors may be integrated in one piece.

In the display panel, the first pixel electrodes, the second pixel electrodes, and the connectors may be integrated in one piece by etching an electrode material film having portions coated with resist material, the portions corresponding to the pixel electrodes and the connectors.

In the above-described display panel, there is no connection boundary, such as natural oxide, between the first pixel electrode and the adjacent second pixel electrode connected by the connector. A connection boundary causes electrical resistance. Since there is no boundary, the decay of the video signal transmitted from the first pixel electrode to the adjacent second pixel electrode connected thereto by the connector is smaller than the case where a connection boundary exists. Consequently, even pixels corresponding to a faulty drive unit can achieve excellent light emission.

Each connector may be coated with an insulator.

The insulator may be a partition defining the pixel electrodes.

Here, at least one of the first pixel electrodes may be divided into parts, and each part may be connected to a different one of the second pixel electrodes adjacent to the at least one of the first pixel electrodes.

In the above-described display panel, each part of the first pixel electrode is connected to a different one of the second pixel electrodes adjacent thereto. This structure reduces the user's uncomfortable feeling when a part of the first pixel electrode is located on the boundary between images.

In the display panel, a power supply path to each first pixel electrode may be cut off so that the first pixel electrode is electrically insulated from the faulty drive unit corresponding thereto, the power supply path being included in the thin-film transistor element of the driving unit corresponding to the first pixel electrode.

In the display panel, each first pixel electrode may be formed so as not to cover the contact hole corresponding thereto.

The interlayer insulation film may include a passivation film formed on the transistor array substrate and a planarizing film formed on the passivation film.

Each first pixel electrode may be connected to any of the second pixel electrodes adjacent thereto in the row direction.

Each first pixel electrode may be connected to any of the second pixel electrodes adjacent thereto in the column direction.

When each column in the display panel has a different luminescent color, such a structure reduces the user's uncomfortable feeling, since each first pixel electrode is connected to a second pixel electrode whose luminescent color is the same.

The display panel may be an electroluminescent display panel.

The display panel may be an organic electroluminescent display panel.

Another aspect of the present invention is a method of manufacturing a display panel, comprising: a preparation step of preparing a substrate; a transistor array substrate formation step of forming a transistor array substrate by arranging drive units on the substrate in a matrix, each drive unit including a thin-film transistor element; an interlayer insulation film formation step of forming an interlayer insulation film on the transistor array substrate, the interlayer insulation film having contact holes, the contact holes corresponding one-to-one to the drive units; and a pixel electrode formation step of arranging a plurality of pixel electrodes on the interlayer insulation film in a matrix, the pixel electrodes corresponding one-to-one to the drive units, wherein the drive units include faulty drive units and non-faulty drive units, the pixel electrodes include first pixel electrodes and second pixel electrodes, the first pixel electrodes corresponding one-to-one to the faulty drive units, and the second pixel electrodes corresponding one-to-one to the non-faulty drive units, a portion of each second pixel electrode is embedded in the contact hole corresponding thereto, and is in contact with a power supply pad of the non-faulty drive unit corresponding thereto, so that the second pixel electrode is electrically connected to the non-faulty drive unit, each first pixel electrode is electrically insulated from the faulty drive unit corresponding thereto, each first pixel electrode is connected by a connector to any of the second pixel electrodes adjacent thereto, the connector being made of conductive material, and a surface of each connector facing the interlayer insulation film is entirely in contact with the interlayer insulation film.

Here, the pixel electrodes and the connectors may be made of a same material, and the first pixel electrodes, the second pixel electrodes, and the connectors may be integrated in one piece.

The pixel electrode formation step may include: an electrode material film formation step of forming an electrode material film on the interlayer insulation film; a resist film formation step of forming a resist film on the electrode material film; a resist film patterning step of patterning the resist film into portions corresponding in shape to the pixel electrodes; a resist material adding step of adding resist material to any of the portions of the resist film located between each first pixel electrode and any of the second pixel electrodes adjacent thereto, thereby filling a gap between each first pixel electrode and any of the second pixel electrodes adjacent thereto; and an etching step of integrally forming the first pixel electrodes, the second pixel electrodes, and the connectors in one piece by etching the electrode material film.

According to the above-described manufacturing method of a display panel, it is unnecessary to add a separate step of forming the connector. Hence, the structure in which the first electrode, the second pixel electrode adjacent thereto, and the connector corresponding thereto are integrated in one piece can be realized by such a simple manufacturing procedure.

Also, since the resist modification is performed after the resist patterning, it is unnecessary to prepare an exposure mask according to the location of the faulty thin-film transistor element. This is therefore advantageous in terms of cost.

The method may further comprise a step of coating each connector with an insulator.

The insulator may be a partition defining the pixel electrodes.

The pixel electrode formation step may include a resist film removing step of removing a portion of the resist film corresponding to a central portion of at least one of the first pixel electrodes by using laser, and in the resist material adding step, the resist material may be added to portions of the resist film corresponding to gaps between the at least one first pixel electrode and two of the second pixel electrodes adjacent thereto, thereby filling the gaps with the resist material, and in the etching step, the at least one first pixel electrode may be divided into parts, and each part of the first pixel electrode may be connected to a different one of the second pixel electrodes adjacent thereto.

The pixel electrode formation step may include a resist film removing step of removing portions of the resist film corresponding to the contact holes corresponding to the first pixel electrodes by using laser, and in the etching step, each first pixel electrode may be formed so as not to cover the contact hole corresponding thereto.

In the above-described method of manufacturing a display panel, faulty drive units are electrically insulated from pixel electrodes by modifying the patterned resist layer in the existing step, namely the resist modification step, instead of adding a separate step of cutting off a wiring line. Hence, the manufacturing procedure can be simplified.

The above-described method of manufacturing a display panel may further comprise: a step of cutting off a power supply path to each first pixel electrode before the insulative material film formation step is performed, so that the first pixel electrode is electrically insulated from the faulty drive unit corresponding thereto, the power supply path being included in the thin-film transistor element of the driving unit corresponding to the first pixel electrode.

In the above-described method, the step of forming the interlayer insulation film may include a step of forming a passivation film on the transistor array substrate and a step of forming a planarizing film on the passivation film.

Another aspect of the present invention is a method of manufacturing a display panel, comprising: a preparation step of preparing a substrate; a transistor array substrate formation step of forming a transistor array substrate by arranging drive units on the substrate in a matrix, each drive unit including a thin-film transistor element; a detection step of detecting, from among the drive units arranged on the substrate, a faulty drive unit including a faulty thin-film transistor element; a positional information acquiring step of acquiring positional information of the faulty drive unit detected in the detection step; a cutting step of cutting off at least part of (i) wiring or (ii) a thin-film transistor element of the faulty derive unit indicated by the acquired positional information, so that the faulty drive unit is electrically insulated, an interlayer insulation film formation step of forming an interlayer insulation film on the transistor array substrate, the interlayer insulation film having contact holes, the contact holes corresponding one-to-one to the drive units; and a pixel electrode formation step of arranging a plurality of pixel electrodes on the interlayer insulation film in a matrix, the pixel electrodes corresponding one-to-one to the drive units, wherein the drive units include faulty drive units and non-faulty drive units, the pixel electrodes include first pixel electrodes and second pixel electrodes, the first pixel electrodes corresponding one-to-one to the faulty drive units, and the second pixel electrodes corresponding one-to-one to the non-faulty drive units, a portion of each second pixel electrode is embedded in the contact hole corresponding thereto, and is in contact with a power supply pad of the non-faulty drive unit corresponding thereto, so that the second pixel electrode is electrically connected to the non-faulty drive unit, and each first pixel electrode is electrically insulated from the faulty drive unit corresponding thereto, wherein the pixel electrode formation step includes: an electrode material film formation step of forming an electrode material film on the interlayer insulation film; a resist film formation step of forming a resist film on the electrode material film; a resist film patterning step of patterning the resist film into portions corresponding in shape to the pixel electrodes; a resist material adding step of adding resist material to any of the portions of the resist film located between each first pixel electrode and any of the second pixel electrodes adjacent thereto, thereby filling a gap between each first pixel electrode and any of the second pixel electrodes adjacent thereto; a resist film removing step of removing a portion of the resist film corresponding to a central portion of at least one of the first pixel electrodes by using laser; and an etching step of integrally forming the first pixel electrodes, the second pixel electrodes, and the connectors in one piece by etching the electrode material film after the resist film removing step is performed.

Another aspect of the present invention is a method of manufacturing a display panel, comprising: a preparation step of preparing a substrate; a transistor array substrate formation step of forming a transistor array substrate by arranging drive units on the substrate in a matrix, each drive unit including a thin-film transistor element; a detection step of detecting, from among the drive units arranged on the substrate, a faulty drive unit including a faulty thin-film transistor element; a positional information acquiring step of acquiring positional information of the faulty drive unit detected in the detection step; an interlayer insulation film formation step of forming an interlayer insulation film on the transistor array substrate, the interlayer insulation film having contact holes, the contact holes corresponding one-to-one to the drive units; and a pixel electrode formation step of arranging a plurality of pixel electrodes on the interlayer insulation film in a matrix, the pixel electrodes corresponding one-to-one to the drive units, wherein the drive units include faulty drive units and non-faulty drive units, and the pixel electrodes include first pixel electrodes and second pixel electrodes, the first pixel electrodes corresponding one-to-one to the faulty drive units, and the second pixel electrodes corresponding one-to-one to the non-faulty drive units, wherein the pixel electrode formation step includes: an electrode material film formation step of forming an electrode material film on the interlayer insulation film; a resist film formation step of forming a resist film on the electrode material film; a resist film patterning step of patterning the resist film into portions corresponding in shape to the pixel electrodes; a resist material adding step of adding resist material to any of the portions of the resist film located between each first pixel electrode and any of the second pixel electrodes adjacent thereto, thereby filling a gap between each first pixel electrode and any of the second pixel electrodes adjacent thereto; a resist film removing step of removing portions of the resist film corresponding to the contact holes corresponding to the first pixel electrodes by using laser; and an etching step of integrally forming the first pixel electrodes, the second pixel electrodes, and the connectors in one piece by etching the electrode material film, each first pixel electrode being formed so as not to cover the contact hole corresponding thereto.

Embodiment 1

Schematic Block Diagram of Display Device 100

FIG. 1A is a block diagram showing an electrical structure of a display device 100 including a display panel 105 pertaining to Embodiment 1 of the present invention. As shown in FIG. 1A, the display device 100 includes a control circuit 101, a memory 102, a scanning line drive circuit 103, a data line drive circuit 104, and a display panel 105 in which pixel circuits are arranged in a matrix. The display panel 105 is an electroluminescent (hereinafter, "EL") display panel, for example, and may be an organic EL display panel. Also, the display panel 105 may be a liquid crystal display panel.

Figure 1B:
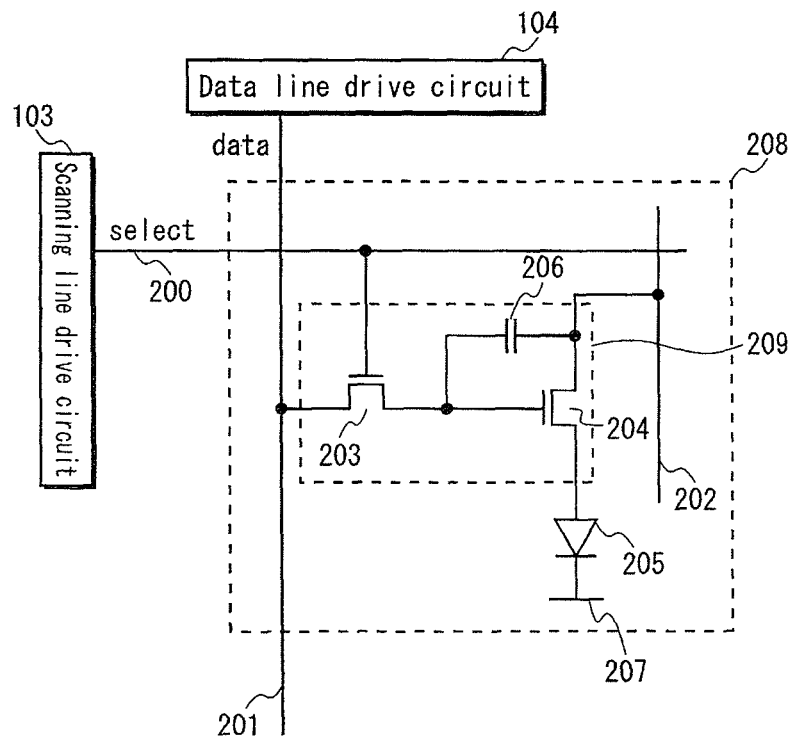
FIG. 1B is a diagram showing the structure of a pixel circuit of the display panel 105 and connections with peripheral circuits.

FIG. 1B is a diagram showing the structure of a pixel circuit of the display panel 105 and connections with peripheral circuits. As shown in FIG. 1B, a pixel circuit 208 includes a gate line 200, a data line 201, a power line 202, a switching transistor 203, a drive transistor 204, a pixel electrode 205, a capacitor 206, and a common electrode 207. The switching transistor 203 and the drive transistor 204 are thin-film transistor elements. A light-emitting layer composed of a plurality of functional sub-layers, or a liquid crystal is formed between the pixel electrode 205 and the common electrode 207.

The peripheral circuits include the scanning line drive circuit 103 and the data line drive circuit 104. The switching transistor 203, the drive transistor 204 and the capacitor 206 constitute a drive unit 209.

When the display panel 105 is an EL display panel, signal voltage provided from the data line drive circuit 104 is applied to a gate terminal of the drive transistor 204 via the switching transistor 203. The drive transistor 204 causes current to flow between the source and drain terminals according to the data voltage applied. The current flowing to the pixel electrode 205 results in a luminance corresponding to the current.

When the display panel 105 is a liquid crystal display panel, current flows between the source and drain terminals of the switching transistor 203 due to the voltage applied to the gate line 200, and the voltage applied to the data line 201 is supplied to the pixel electrode 205.

—Layout—

Figure 2:
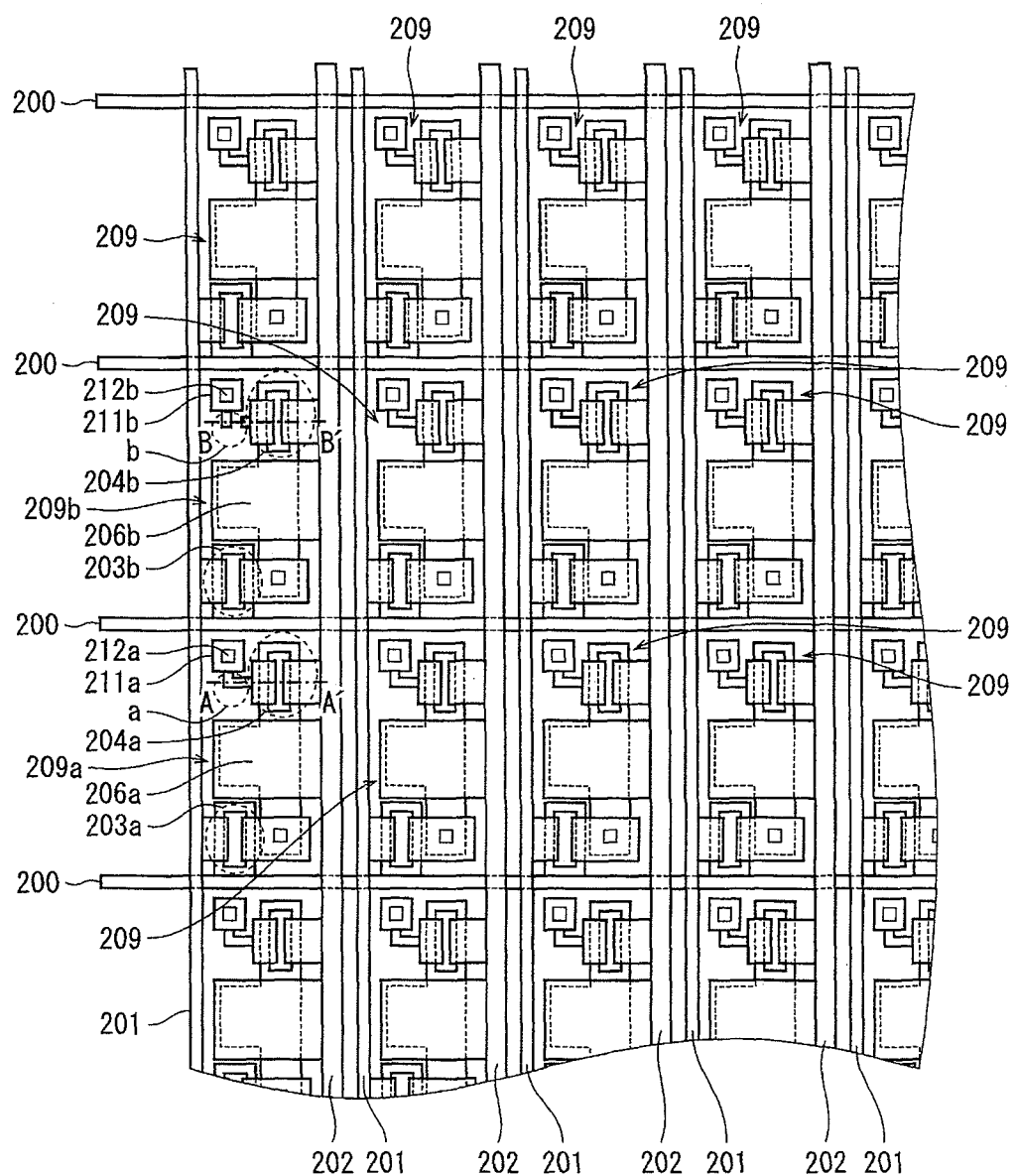
FIG. 2 is a schematic plan view showing an arrangement of gate lines 200, data lines 201, power lines 202 and drive units 209 included in the display panel 105.

Next, description is provided for the arrangement of the gate lines 200, the data lines 201, the power lines 202 and the drive units 209 included in the display panel 105. FIG. 2 is a schematic plan view showing the arrangement of the gate lines 200, the data lines 201, the power lines 202 and the drive units 209 included in the display panel 105.

As shown in FIG. 2, the drive units 209 are arranged in a matrix. Some of the drive units 209 are assumed to be faulty, and the others are assumed to be not faulty (i.e. operate normally). The term "faulty drive unit" means a drive unit that includes a thin-film transistor that is always on or a thin-film transistor that is always off. The following explanation focuses on the two drive units (a drive unit 209a and a drive unit 209b) that are adjacent in the column (Y-axis) direction. In FIG. 2, the drive unit 209a is a drive unit that is not faulty, and the drive unit 209b is a drive unit that is faulty.

In the non-faulty drive unit 209a, a drive transistor 204a and a power supply pad 211a for supplying power to the pixel electrode corresponding to the drive unit 209a are connected by a wiring line (see the dashed lines a). Thus, the drive transistor 204a supplies power to the pixel electrode connected to the power supply pad 211a via a contact hole 212a. In other words, the drive unit 209a is electrically connected to the corresponding pixel electrode.

In contrast, in the faulty drive unit 209b, the wiring line connecting the drive transistor 204b and the power supply pad 211b for supplying power to the pixel electrode corresponding to the drive unit 209b is cut (see the dashed lines b). Thus, the drive transistor 204b does not supply power to the pixel electrode connected to the power supply pad 211b via a contact hole 212b. In other words, the drive unit 209b is electrically insulated from the corresponding pixel electrode.

A gate line 200 is provided along one side of each row consisting of a series of drive units. A data line 201 is provided along one side of each column consisting of a series of drive units, and a power line 202 is provided along the other side.

Figure 3:
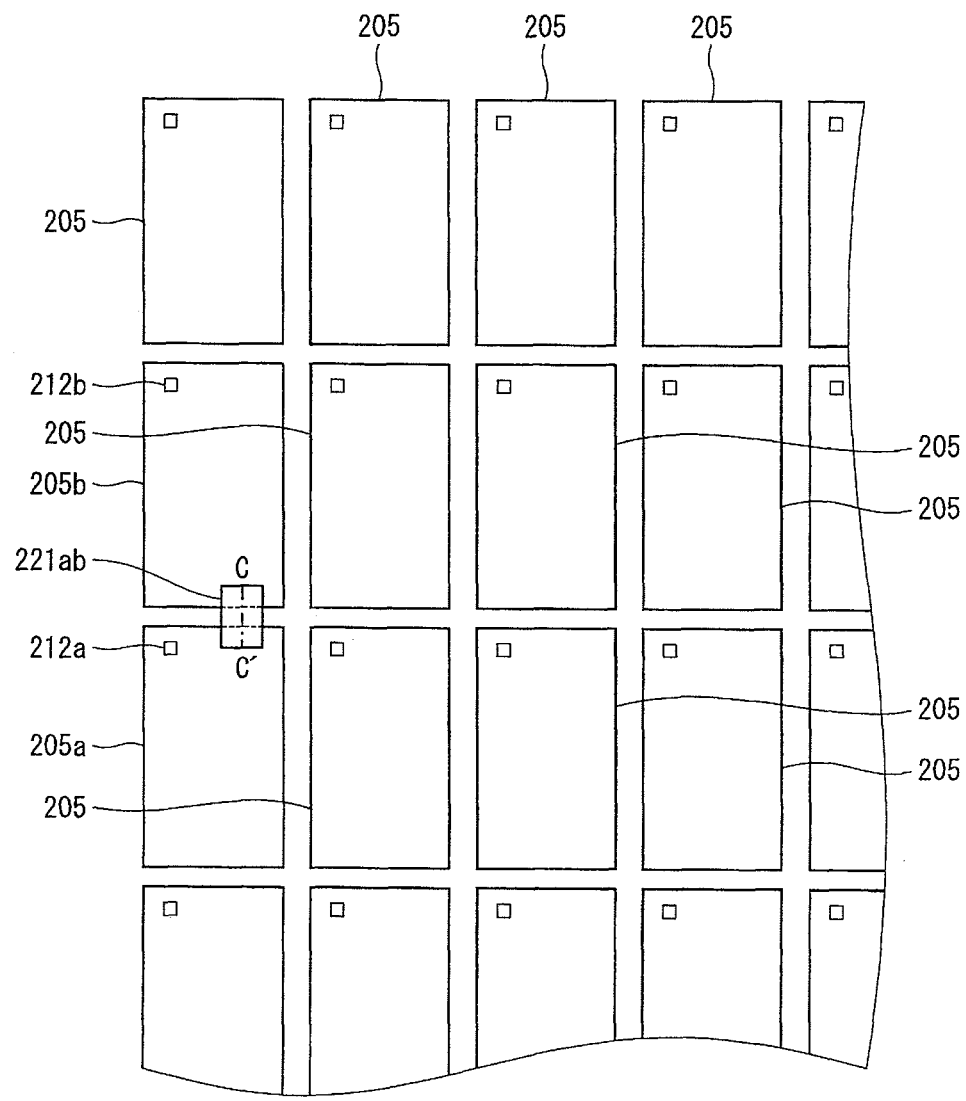
FIG. 3 is a schematic plan view showing an arrangement of the pixel electrodes 205 included in the display panel 105.
Figure 3:
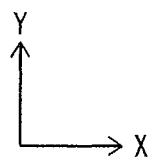

FIG. 3 is a schematic plan view showing an arrangement of the pixel electrodes 205 included in the display panel 105. As shown in FIG. 3, the pixel electrodes 205 are arranged in a matrix. The pixel electrodes 205 are provided in one-to-one correspondence with the drive units 209 shown in FIG. 2. The pixel electrodes 205 therefore include pixel electrodes (second pixel electrodes) that correspond one-to-one to drive units that are not faulty, and pixel electrodes (first pixel electrodes) that correspond one-to-one to drive units that are faulty. The following explanation focuses on the two pixel electrodes (a pixel electrode 205a and a pixel electrode 205b) that are adjacent in the column (Y-axis) direction. In FIG. 3, the pixel electrode 205a represents a pixel electrode corresponding to the drive unit 209a, and the pixel electrode 205b represents a pixel electrode corresponding to the drive unit 209b.

The pixel electrode 205a and the pixel electrode 205b are connected via a connector 22 lab made of conductive material. When the columns in the display panel 105 emit light of different colors, it is preferable that the pixel electrode 205b is connected to the pixel electrode 205a that is adjacent to the pixel electrode 205b in the column direction, as shown in FIG. 3.

As described above, in the drive unit 209b, the wiring line extending from the drive transistor 204b to the power supply pad 211b is cut off, and the pixel electrode 205b is connected to the pixel electrode 205a and is driven by the drive unit 209a. That is, both pixel electrodes are driven by the drive unit 209a.

Accordingly, occurrence of dark dots and bright dots on the display panel 105 caused by the faulty drive unit 209b is prevented, and degradation of the image quality is therefore prevented.

—Cross-Sectional View—

Figure 4A:
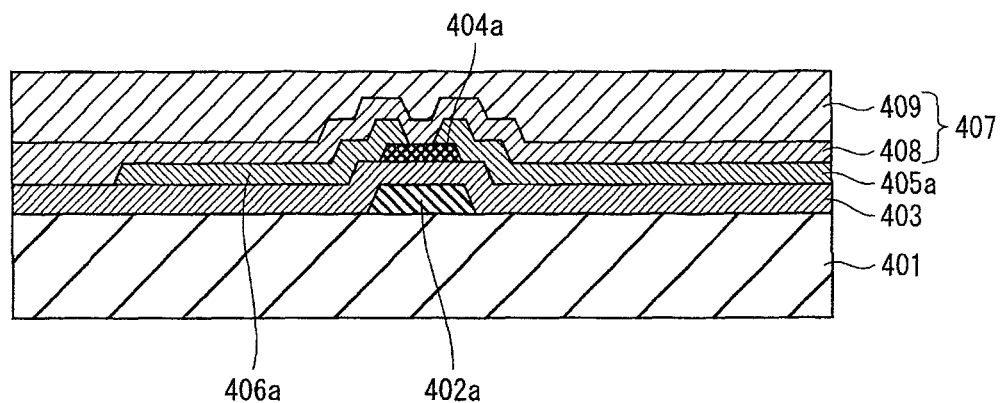
FIG. 4A is a partial cross-sectional view (cross-section along A-A' in FIG. 2) schematically showing the structure of the display panel 105.

FIG. 4A is a partial cross-sectional view (cross-section along A-A' in FIG. 2) schematically showing the structure of the display panel 105. FIG. 4A shows the part corresponding to the drive transistor 204a in the non-faulty drive unit 209a. As shown in FIG. 4A, a gate electrode 402a is disposed on a substrate 401, and a gate insulation film 403 is formed on the substrate 401 on which the gate electrode 402a has been disposed. A semiconductor layer 404a is disposed above the gate electrode 402a on the gate insulation film 403. In addition, source drain electrode wiring lines (hereinafter referred to as "SD electrode wiring lines") 405a and 406b are disposed on the gate insulation film 403. Each of the SD electrode wiring lines 405a and 406a partially overlaps the semiconductor layer 404a. The SD electrode wiring lines 405a and 406a have a gap therebetween, and the gap is located above the semiconductor layer 404a. Furthermore, an interlayer insulation film 407 is formed to coat the SD electrode wiring lines 405a and 406a. The interlayer insulation film has a two-layer structure, for example, and is composed of a passivation film 407 and a planarizing film 408. The passivation film 408 is formed to coat the SD electrode wiring lines 405a and 406a in order to protect the thin-film transistor element. The planarizing film 409 is formed on the passivation film 408 in order to flatten the surface gap between the part where the thin-film transistor element is formed and the part where the thin-film transistor element is not formed.

Figure 4B:
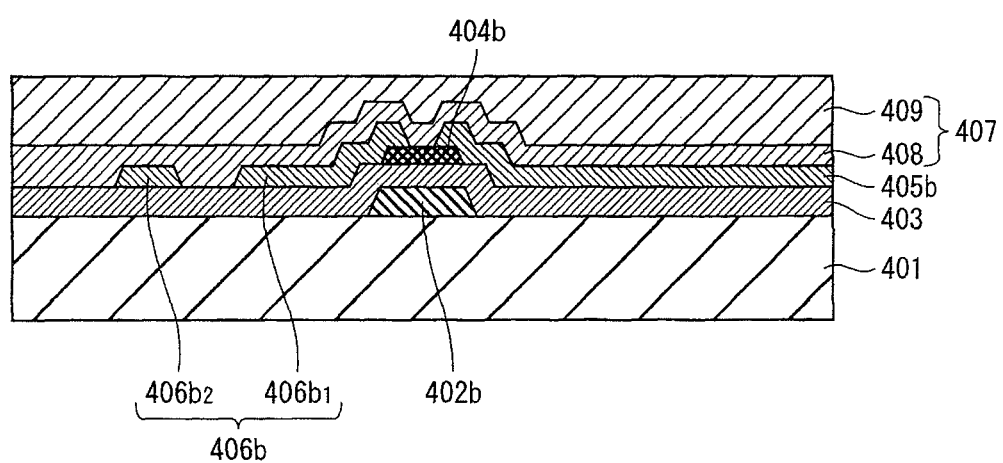
FIG. 4B is a partial cross-sectional view (cross-section along B-B' in FIG. 2) schematically showing the structure of the display panel 105.

FIG. 4B is a partial cross-sectional view (cross-section along B-B' in FIG. 2) schematically showing the structure of the display panel 105, and particularly showing the part corresponding to the drive transistor 204b in the faulty drive unit 209b. As shown in FIG. 4B, a gate electrode 402b is disposed on the substrate 401, and the gate insulation film 403 is formed on the substrate 401 on which the gate electrode 402b has been disposed. A semiconductor layer 404b is formed on the portion of the gate insulation film 403 above the gate electrode 402b. In addition, SD electrode wiring lines 405b and 406b are disposed on the gate insulation film 403. Each of the SD electrode wiring lines 405b and 406b partially overlaps the semiconductor layer 404b. The SD electrode wiring lines 405b and 406b have a gap therebetween, and the gap is located above the semiconductor layer 404b.

Note that FIG. 4B is different from FIG. 4A in that the SD electrode wiring line 406b is cut off. That is, the SD electrode wiring line 406b is composed of a section 406b$_1$ and a section 406b$_2$, and there is a gap between them. Therefore, no power is provided from the drive unit 209b to the pixel electrode corresponding to the drive unit 209b.

Furthermore, an interlayer insulation film 407 is formed to coat the SD electrode wiring lines 405b and 406b. The interlayer insulation film 407 has a two-layer structure, for example, and is composed of a passivation film 408 and a planarizing film 409 formed on the passivation film 408.

Figure 5:
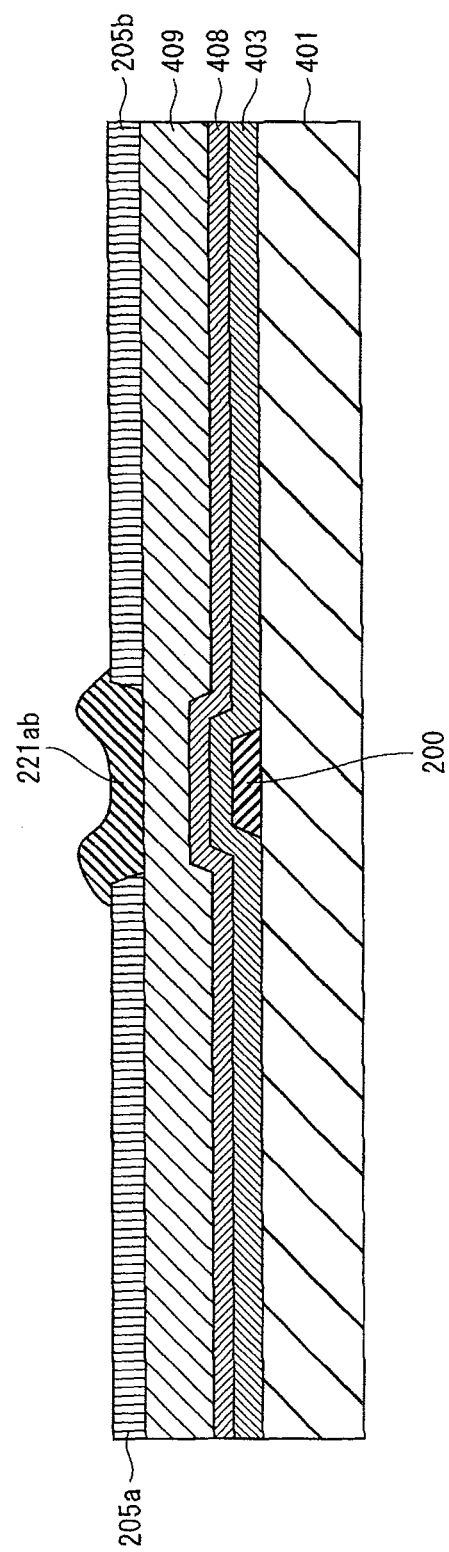
FIG. 5 is a partial cross-sectional view (cross-section along C-C' in FIG. 3) schematically showing the structure of the display panel 105.

FIG. 5 is a partial cross-sectional view (cross-section along C-C' in FIG. 3) schematically showing the structure of the display panel 105. A gate line 200 is disposed on the substrate 401, and a gate insulation film 403 is formed on the substrate 401 on which the gate line 200 has been disposed. The passivation film 408 and the planarizing film 409 are layered on the gate insulation film 403 in this order. On the planarizing film 409, the pixel electrode 205a and the pixel electrode 205b are disposed with a gap therebetween. A connector 221ab is formed to connect these pixel electrodes. The connector 221ab is a metal thin film. On the area between the pixel electrode 205a and the pixel electrode 205b where the connector 221ab is formed, the surface of the connector 221ab facing the planarizing film 409 is entirely in contact with the planarizing film 409. Hence, the connector 221ab is unlikely to break.

Regarding the positional relationship between the gate line 200 and the connector 221ab, they face each other, with the gate insulation film 403, the passivation film 408 and the planarizing film 409 interposed therebetween. The planarizing film 409 is a thick film, and the film thickness thereof is 4000 nm for example. Hence, pin holes are unlikely to occur in the planarizing film 409. Therefore, the gate line 200 formed below the connector 221ab and the planarizing film 409 is prevented from causing short circuit.

It should be noted here that parasitic capacitance occurs between the gate line 200 and the connector 221ab. Since the pixel electrode 205b is electrically connected to the pixel electrode 205a, they have a same potential, and their electrical signals are in-phase. Due to parasitic capacitance, delay in video signal transmission or cross-talk could occur between adjacent pixels, which leads to degradation of the image quality.

In Embodiment, however, since the planarizing film 409 is a thick film, the gap between the connector 221ab and the gate line 200 is relatively wide, the parasitic capacitance between the connector 221ab and the gate line 200 is small. Such a structure prevents degradation of the image quality due to delay in video signal transmission or occurrence of cross-talk.

In the description above, the structures of the drive unit 209a and the pixel electrode 205a are respectively explained as examples of a non-faulty drive unit and a pixel electrode corresponding to the drive unit. Note that the other non-faulty drive units and the pixel electrodes corresponding thereto have the same structures.

Similarly, although the structures of the pixel electrode 205a, the pixel electrode 205b and the connector 221ab are respectively explained above as examples of the first pixel electrode, the second pixel electrode connected to the first pixel electrode, and the connector connecting them, the other first pixel electrodes, the second pixel electrodes connected to the first pixel electrodes, and the connectors connecting them have the same structures.

—Manufacturing Procedures—

Figure 6:
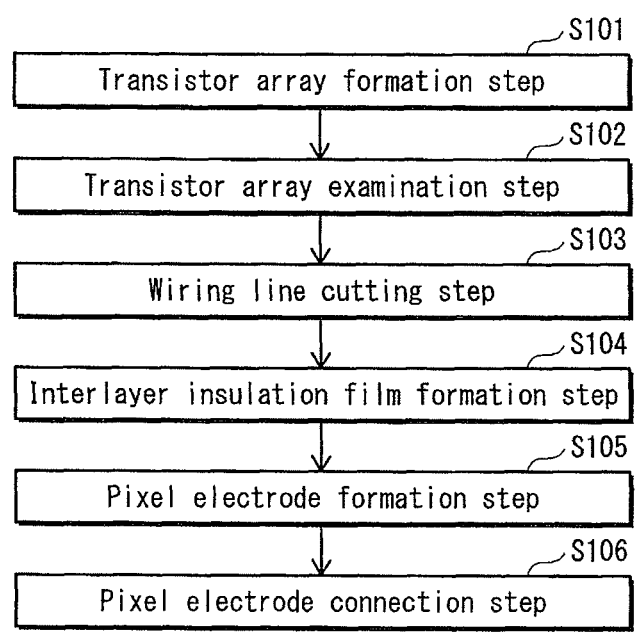
FIG. 6 is a diagram showing steps for manufacturing the display panel 105.

The following explains the manufacturing procedures for the display panel 105. In particular, from the step for forming a transistor array to the step for forming pixel electrodes are explained here. FIG. 6 is a diagram showing the steps for manufacturing the display panel 105.

First, in the transistor array formation in Step S101, a transistor array substrate is formed by forming drive units in a matrix on a substrate.

In the transistor array examination in Step S102, the drive units formed in a matrix are examined to specify faulty thin-film transistor elements. In particular, a defect inspection device sets the addresses of the thin-film transistor elements of the drive units formed in a matrix. Next, electrical potential is applied to the gate lines, the data lines and the power lines, and a potential is measured at each address by using a contactless electrometer. If the potential obtained by the measurement is a normal value, it is determined that the thin-film transistor element corresponding to the address is not faulty. On the other hand, if the potential obtained by the measurement is not a normal value, it is determined that the thin-film transistor element corresponding to the address is faulty. Note that there are two types of faulty elements. One is a thin-film transistor element that is always on. Such a state is referred to as a short-circuit state. The other is a thin-film transistor element that is always off. Such a state is referred to as an OFF state. The defect inspection device determines in which state a faulty thin-film transistor is, by adjusting the potential to be applied to each signal line. That is, the defect inspection device determines, for each thin-film transistor element, whether the element is normal, or in the short-circuit state, or in the OFF state.

In wiring line cutting in step S103, the power supply path to the corresponding pixel electrode in the thin-film transistor element determined as being faulty is cut. For example, a wiring line connected to the power supply pad in the thin-film transistor is cut.

When the faulty element is in the short-circuit state, it is necessary to cut the power supply path to the pixel electrode. When the faulty element is in the OFF state, however, it is not necessary to cut the power supply path to the pixel electrode. This is because when the thin-film transistor element is in the OFF state, the pixel corresponding thereto is a dark dot, and is unnoticeable even when the pixels around it emit light.

On the other hand, when the faulty thin-film transistor element is in the ON state, the pixel corresponding thereto is a bright dot, and is noticeable for the user when the pixels around it are unlighted (e.g. when no image is displayed on the display panel or in the case of raster display with a low luminance), even if there is only one bright dot. Therefore, a display panel having even only one bright dot is considered as a faulty panel. For this reason, it is necessary to cut the wiring line to the thin-film transistor in the ON state.

In the interlayer insulation film formation in Step S104, an interlayer insulation film is formed on the transistor array substrate. The interlayer insulation Elm has a structure in which a contact hole is provided in portions corresponding to the power supply pad of each drive unit.

In the pixel electrode formation in Step S105, pixel electrodes are formed in matrix so as to correspond one-to-one to the drive units. In this embodiment, each of the pixel electrodes is formed so that a portion thereof enters into the corresponding contact hole, and the portion is in contact with the corresponding power supply pad.

In the pixel electrode connection in Step S106, each of the first pixel electrodes is connected to any of the second pixel electrodes adjacent to the pixel electrode, via a connector.

The pixel electrode formation step and the pixel electrode connection step are explained below in detail, with reference to FIGS. 7A through 7F and FIGS. 8A and 8B. FIGS. 7A through 7F constitute a process chart showing an example of part of a pixel electrode formation step and a pixel electrode connection step. FIGS. 8A and 8B constitute a process chart showing an example of part of the pixel electrode formation step and the pixel electrode connection step, following the part shown in FIGS. 7A through 7F.

Figure 7A:
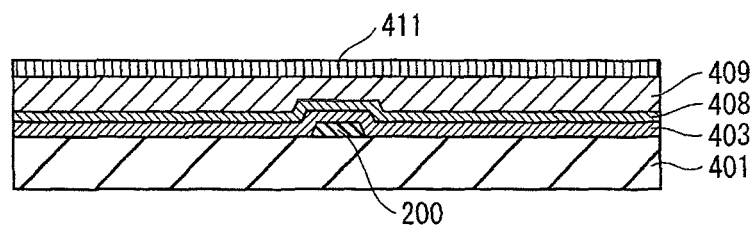
FIGS. 7A through 7F constitute a process chart showing an example of part of a pixel electrode formation step and a pixel electrode connection step.
Figure 8A:
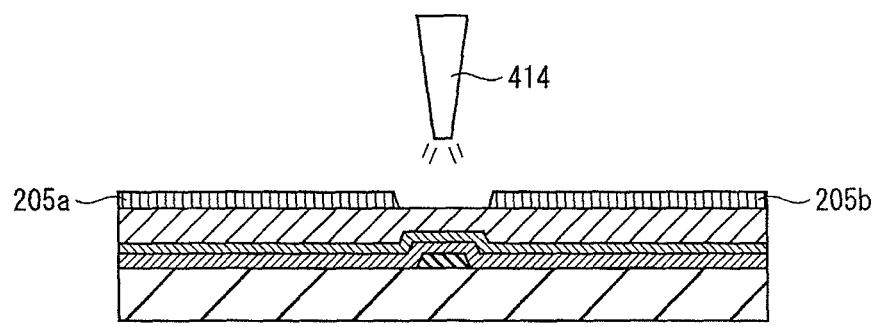
FIGS. 8A and 8B constitute a process chart showing an example of part of the pixel electrode formation step and the pixel electrode connection step, following the part shown in FIGS. 7A through 7F.
Figure 8B:
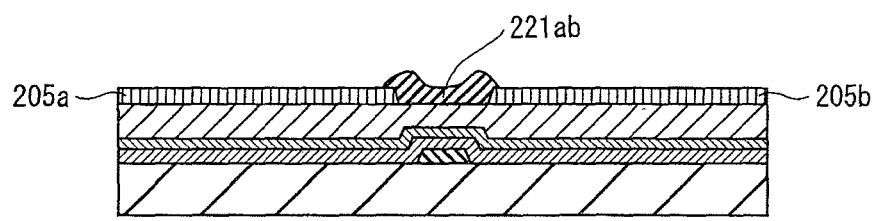

FIG. 7A shows that the gate line 200 is formed on the substrate 401, the gate insulation film 403 is formed to coat the gate line 200, and the passivation film 408, the planarizing film 409 and an electrode material film 411 are layered on the gate insulation film 403 in this order.

Figure 7B:
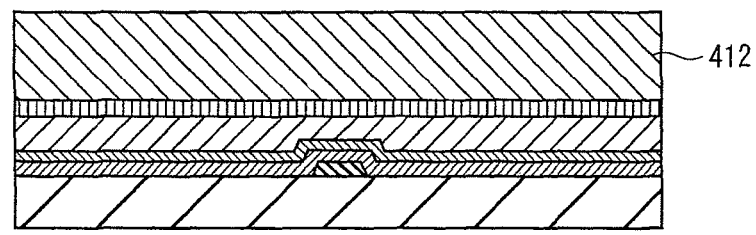
Figure 7C:
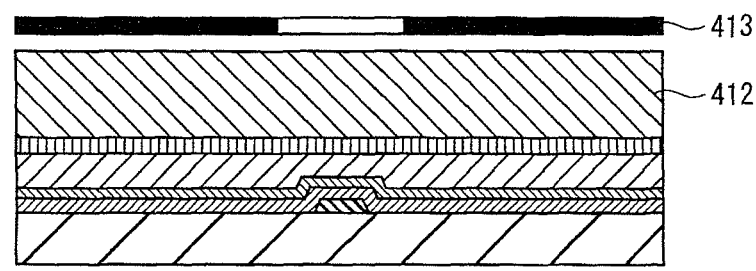
Figure 7D:
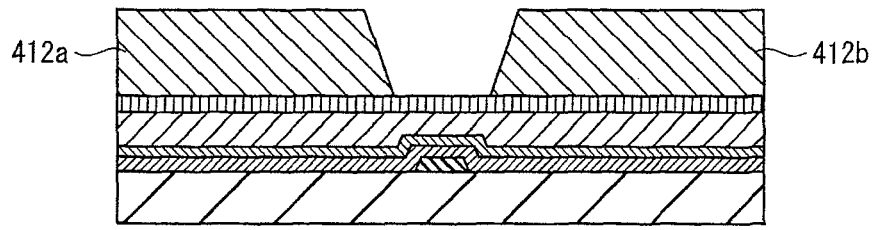
Figure 7E:
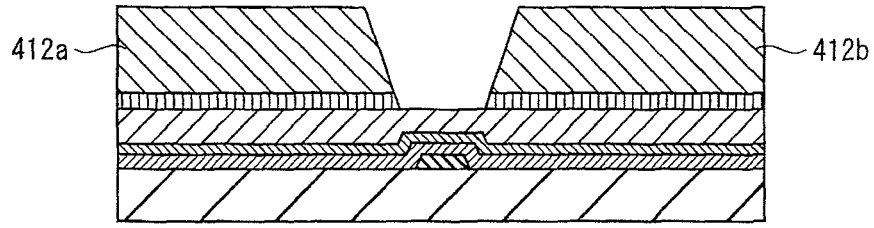
Figure 7F:
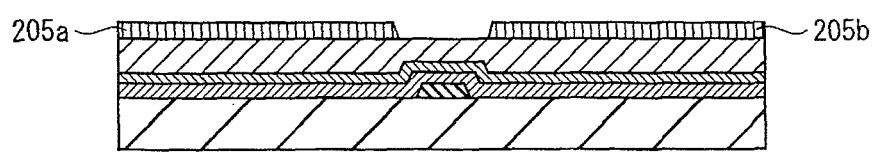

After that, as shown in FIG. 7B, a resist layer 412 is formed on the electrode material layer 411. Next, as shown in FIG. 7C, a mask 413 with apertures having a predetermined shape is layered on the resist layer 412. Then, the resist layer is exposed to light from above the mask 413. The remaining resist is washed off by developer (e.g. TMAH (Tetra methyl ammonium hydroxide) aqueous solution). Patterning on the resist layer 412 thus completes. As shown in FIG. 7D, in the patterned resist layer 412, a portion above the gate line 200 has been removed. Thus the resist layer 412 consists of a resist portion 412a and a resist portion 412b. Next, wet etching is performed on the electrode material film 411 by using a wet etching solution. As a result, as shown in FIG. 7E, only the portions of the electrode material film 411 coated with the resist portions 412a and 412b will remain. Next, the resist portions 412a and 412b above the electrode material film portion are removed with an organic remover. As a result, the pixel electrodes 205a and 205b are formed as shown in FIG. 7F. This concludes the explanation of the pixel electrode formation step.

Next, as shown in FIG. 8A, a metal thin film is disposed between the adjacent pixel electrodes 205a and 205b by laser CVD414, and the pixel electrodes 205a and 205b are connected with the connector 221ab as shown in FIG. 8B.

—Structure of Display Panel 105—

In this section, the structure of an EL display panel as an example of the display panel 105 is explained.

Figure 9:
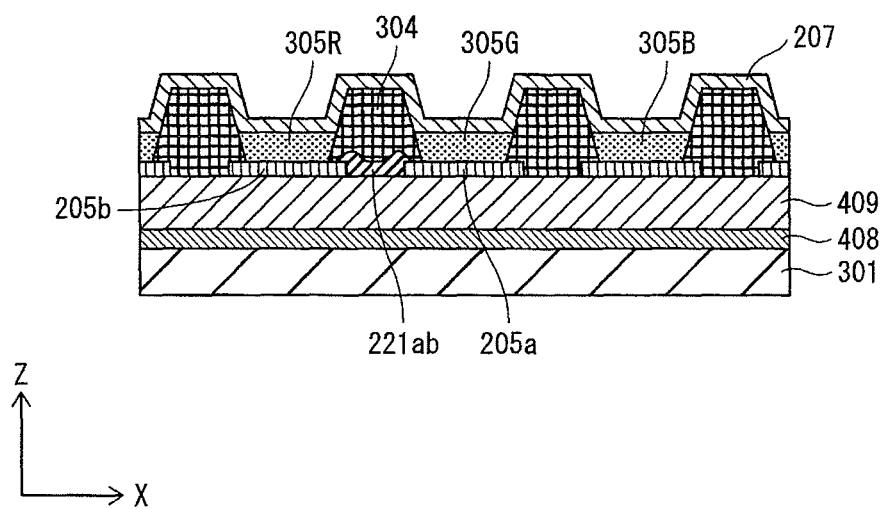
FIG. 9 is a partial cross-sectional view schematically showing primary components of the display panel 105.

FIG. 9 is a partial cross-sectional view schematically showing primary components of the display panel 105. As shown in FIG. 9, the passivation film 408 is formed on the transistor array substrate 301, and the planarizing film 409 is formed on the passivation film 408. The pixel electrodes (anodes) 205a and 205b are formed on the planarizing film 409. The pixel electrodes are formed by patterning so as to be in a matrix composed of sub-pixels. Three sub-pixels that are adjacent in X axis direction constitute one pixel.

A bank 304 is formed between adjacent pixel electrodes 205a and 205b. In each area defined by the banks 304, a light-emitting layer 305G or 305R, each having a predetermined color, is layered on the pixel electrode 205a or 205b. The light-emitting layers 305R, 305G and 305B are organic light-emitting layers, for example. A common electrode (cathode) 207 is formed on the light-emitting layers 305R, 305G and 305B so as to extend across the area defined by the banks 304 and to be continuous with another common electrode on the adjacent light-emitting layer.

The pixel electrode 205a and the pixel electrode 205b are connected by the connector 221ab. The connector 221ab is coated with the bank 304. Hence, even if part of connector 221ab is formed to overlap the pixel electrodes 205a and the 205b, such a structure does not affect the subsequent steps.

Although not depicted in FIG. 9, the passivation film 408 and the planarizing film 409 formed on the transistor array substrate 301 are provided with contact holes in correspondence with the drive units. Each of the pixel electrodes 205a and the 205b is formed to coat the inside surface of the corresponding contact hole so that the pixel electrode is in contact with the corresponding power supply pad.

The following explains in detail the material of each component and so on in the case the display panel 105 is an EL display panel.

—Structure of Each Component—

The transistor array substrate 301 includes a substrate and a plurality of drive units arranged on the substrate in a matrix.

The passivation film 408 is made of insulating material such as polyimide resin, silicone resin, etc.

The planarizing film 409 is made of insulating material such as polyimide resin, acrylic-based resin, etc.

The pixel electrodes 205a and 205b are made of aluminum (Al) or an aluminum alloy. Alternatively, the pixel electrodes 205a and 205b may be made of silver (Ag), an alloy of silver, palladium and copper, an alloy of silver, rubidium and gold, an alloy of molybdenum and chrome (MoCr), an alloy of nickel and chrome (NiCr), etc. When the display panel 105 is a top-emission display panel, it is preferable that the pixel electrodes 205a and 205b are made of light-reflective material. Note that the other pixel electrodes 205 are made of similar material as the pixel electrodes 205a and 205b.

The connector 221ab is made of aluminum (Al) or an aluminum alloy. Alternatively, the pixel electrode 205 may be made of silver (Ag), an alloy of silver, palladium and copper, an alloy of silver, rubidium and gold, an alloy of molybdenum and chrome (MoCr), an alloy of nickel and chrome (NiCr), etc. The connector 221ab may be made of the same material as the pixel electrodes 205a and 205b.

The banks 304 are made of organic material, such as resin, and are insulative. Examples of the organic material include acrylic resin, polyimide resin, and novolac-type phenolic resin. It is preferable that the banks 304 have organic solvent resistance. Furthermore, since the banks 304 are etched and baked in some cases, it is preferable that the banks be formed from highly resistant material that will not change in shape or quality during the etching and baking processes.

When the light-emitting layers 305R, 305G and 305B are organic light-emitting layers, examples of the material in the light-emitting layers include a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

The common electrode (cathode) 207 is made of, for example, indium tin oxide (ITO), indium zinc oxide (IZO), etc. When the display panel 105 is a top-emission display panel, it is preferable that the common electrode 207 is made of light-transmissive material.

Although the display panel pertaining to the present invention is described above based on Embodiment, the present invention should not be limited to Embodiment, as a matter of course. For example, the following modifications may be made.

<Modification 1>

The following explains a modification example in which the structure of the connector is altered. In this modification, the arrangement of the gate line 200, the data line 201, the power line 202 and the drive unit 209 in the display panel is the same as shown in FIG. 2.

—Arrangement of Pixel Electrodes in Display Panel—

Figure 10:
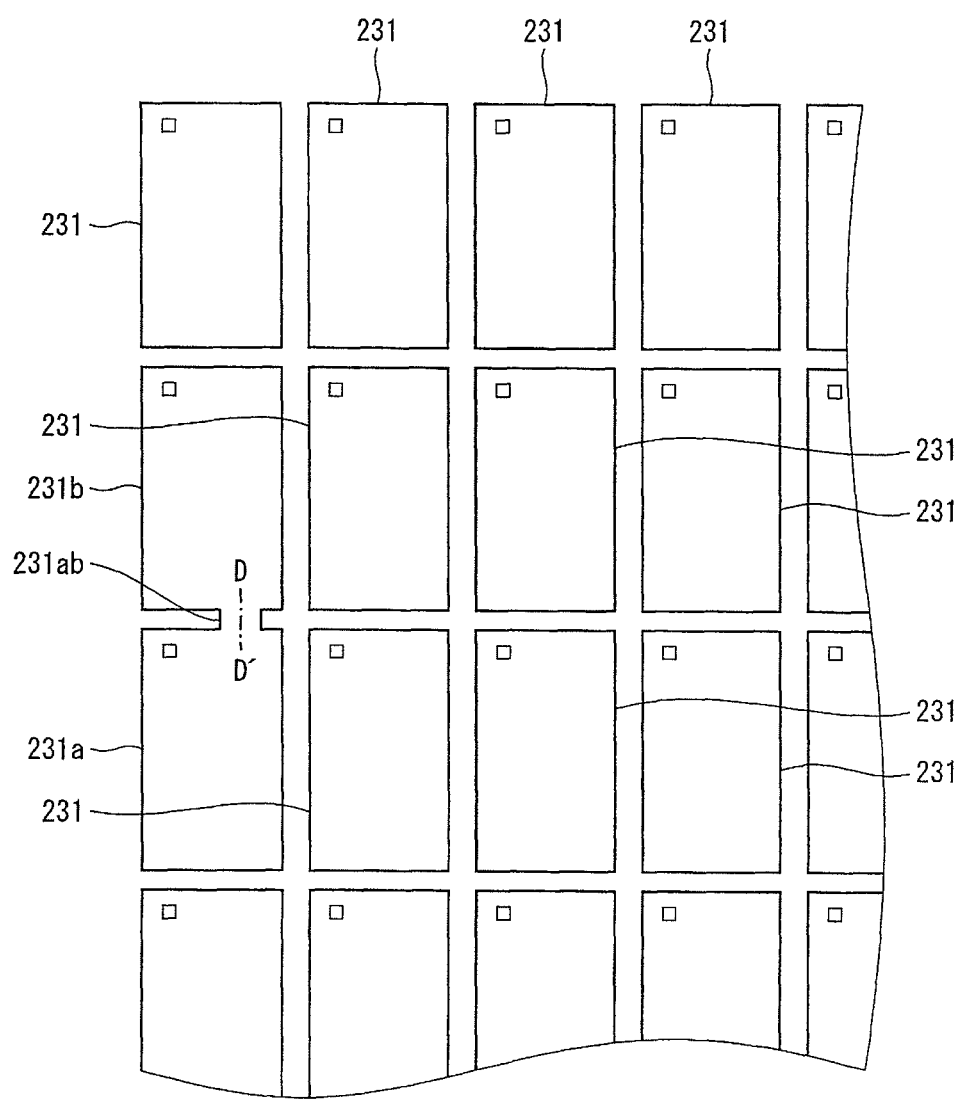
FIG. 10 is a schematic plan view showing pixel electrodes included in a display panel pertaining to Modification 1.

FIG. 10 is a schematic plan view showing pixel electrodes included in a display panel pertaining to Modification 1. As shown in FIG. 10, the pixel electrodes 231 are arranged in a matrix. The pixel electrodes 231 are provided in one-to-one correspondence with the drive units 209 shown in FIG. 2. Therefore, as with the structure shown in FIG. 3, the pixel electrodes 231 therefore include pixel electrodes (second pixel electrodes) that correspond one-to-one to drive units that are not faulty, and pixel electrodes (first pixel electrodes) that correspond one-to-one to drive units that are faulty. In FIG. 10, the pixel electrode 231a represents the pixel electrode corresponding to the drive unit 209a, and the pixel electrode 231b represents the pixel electrode corresponding to the drive unit 209b.

As with the structure shown in FIG. 3, the pixel electrode 231a and the pixel electrode 231b are connected via a connector 231ab made of conductive material.

The difference from the structure shown in FIG. 3 is that the pixel electrode 231a, the pixel electrode 231b and the connector 231ab are integrated in one piece.

—Cross-Sectional View—

Figure 11:
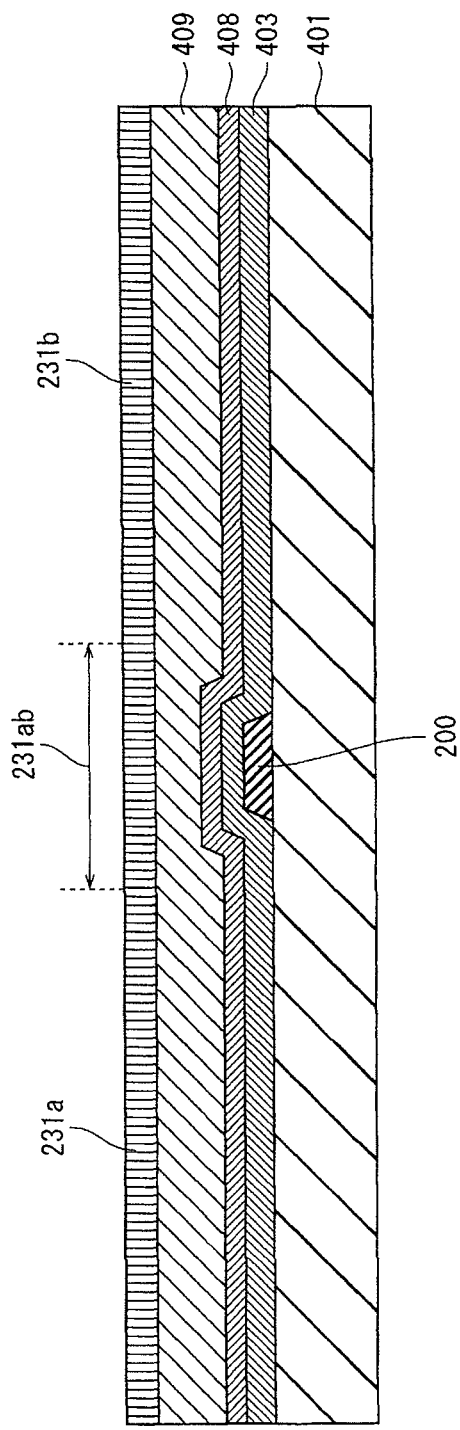
FIG. 11 is a partial cross-sectional view (cross-section along D-D' in FIG. 10) schematically showing the structure of the display panel pertaining to Modification 1.

FIG. 11 is a partial cross-sectional view (cross-section along D-D' in FIG. 10) schematically showing the structure of the display panel pertaining to Modification 1. As shown in FIG. 11, a gate line 200 is disposed on the substrate 401, and the gate insulation film 403 is formed on the substrate 401 on which the gate line 200 has been disposed. The passivation film 408 and the planarizing film 409 are layered on the gate insulation film 403 in this order. The structure described above is the same as in FIG. 5. In Modification 1, however, the connector is not independently formed to connect the pixel electrodes disposed on the planarizing film 409 with a gap therebetween. Instead, the pixel electrodes 231a and 231b and the connector 231ab are made of a same material and are integrated in one piece.

That is, there is no connection boundary, such as natural oxide, between the pixel electrode 231a and the pixel electrode 231b connected by the connector 231ab. A connection boundary causes electrical resistance. Since there is no boundary, the connection between the pixel electrode 231a and the pixel electrode 231b causes only pure electrical resistance. Therefore, the decay of the video signal transmitted from the pixel electrode 231a to the pixel electrode 231b is smaller than the case where a connection boundary exists. Consequently, excellent light emission can be achieved even in pixels corresponding to a faulty drive unit.

Furthermore, on the area between the pixel electrode 231a and the pixel electrode 231b where the connector 231ab is formed, the surface of the connector 231ab facing the planarizing film 409 is entirely in contact with the planarizing film 409. The connector 231ab is therefore unlikely to break, as a matter of course.

—Manufacturing Procedures—

Figure 12:
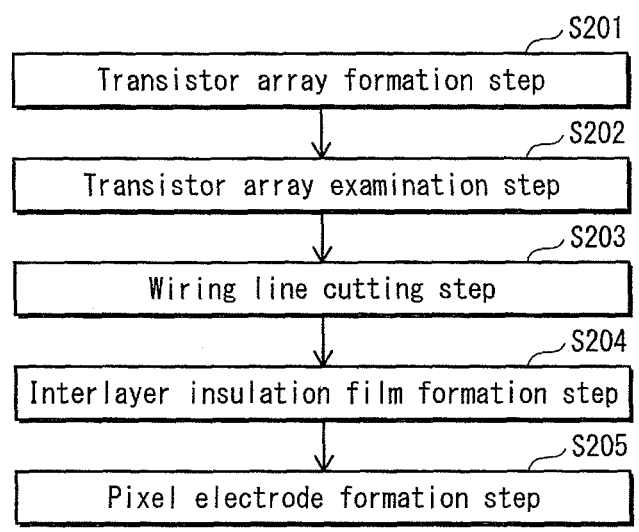
FIG. 12 is a diagram showing steps for manufacturing the display panel 105 pertaining to Modification 1.
Figure 13A:
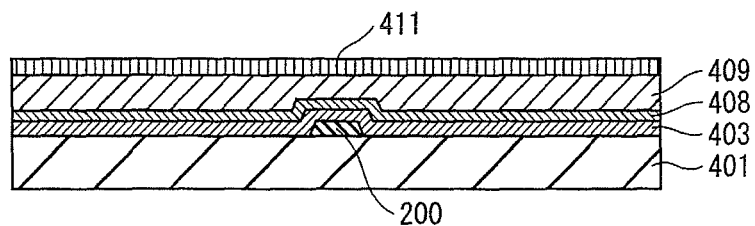
FIGS. 13A through 13D constitute a process chart showing an example of part of a pixel electrode formation step pertaining to Modification 1.
Figure 13B:
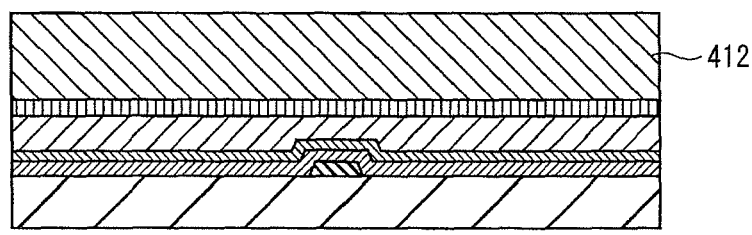
Figure 13C:
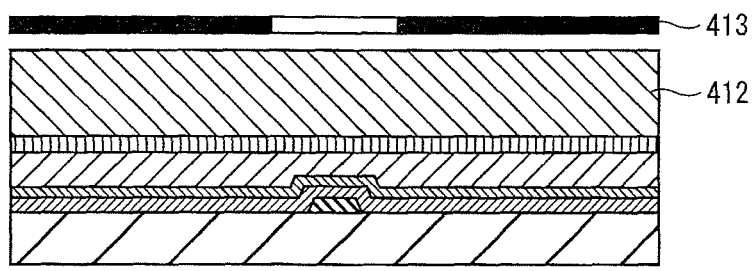
Figure 13D:
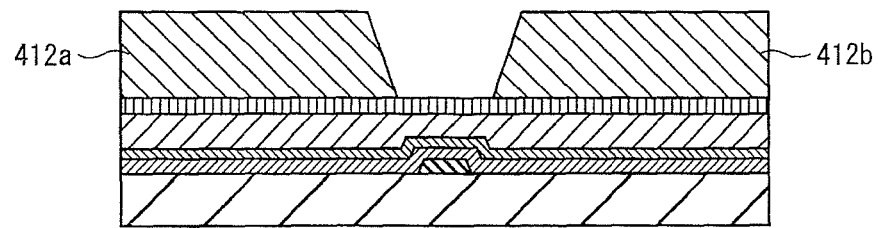

The following explains the manufacturing procedures for the display panel pertaining to Modification 1. FIG. 12 is a diagram showing steps for manufacturing the display panel pertaining to Modification 1.

Steps S201 to S204 in FIG. 12 are the same as Steps S101 to S104 in FIG. 6. Hence, descriptions thereof are omitted.

In the pixel electrode formation in Step S205, pixel electrodes are formed in matrix so as to correspond one-to-one to the drive units. A photolithographic technique is used for forming the pixel electrodes. Generally, when a photolithographic technique is used for forming the pixel electrodes, a resist modification step is performed after the patterning of the resist layer. This step aims to detect and repair a break or the likes in the patterned resist layer. In this step, resist material is added by using a dispenser, or part of the patterned resist layer is removed by using laser, for example. In this Modification, a resist material is added in the resist modification, to the area between the pixel electrode 231a and the pixel electrode 231b. As a result, the pixel electrodes 231a and 231b and the connector 231ab are integrated in one piece.

The following describes the details with reference to FIGS. 13A-13D and FIGS. 14A-14D.

FIGS. 13A through 13D constitute a process chart showing an example of part of a pixel electrode formation step pertaining to Modification 1. FIGS. 14A through 14D constitute a process chart showing an example of part of the pixel electrode formation step, following the part shown in FIGS. 13A through 13D. Since FIGS. 13A through 13D are the same as FIGS. 7A through 7D, descriptions thereof are omitted.

Figure 14A:
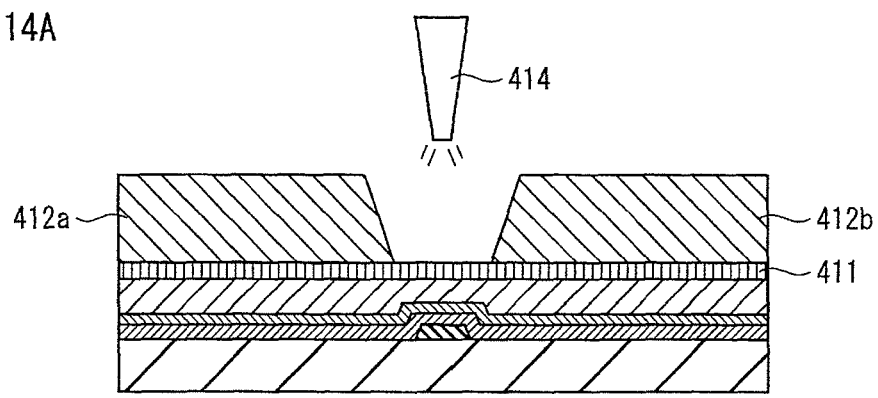
FIGS. 14A through 14D constitute a process chart showing an example of part of the pixel electrode formation step, following the part shown in FIGS. 13A through 13D.
Figure 14B:
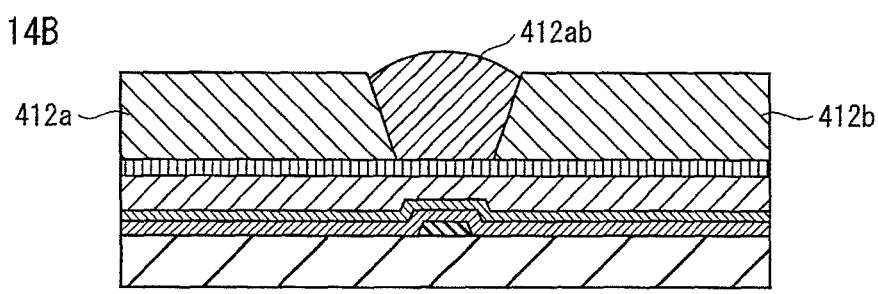

After the patterning on the resist layer, a resist material is added to the gap between the resist portion 412a and the resist portion 412b (from which the electrode material film 411 is exposed) as shown in FIG. 14A, by using a dispenser 414. As a result, the gap is filled with a resist material 412ab, as shown in FIG. 14B.

Figure 14C:
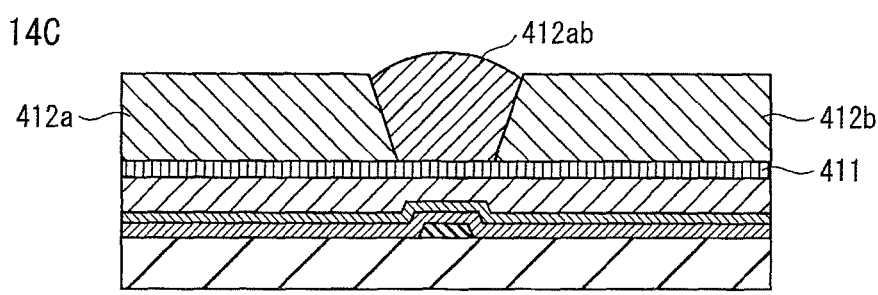

Next, wet etching is performed on the electrode material film 411 by using a wet etching solution. As a result, only the portions of the electrode material film 411 coated with the resist material will remain. Here, as shown in FIG. 14B, the gap between the resist portion 412a and the resist portion 412b is also coated with the resist material 412ab. Therefore, as shown in FIG. 14C, the electrode material film 411 remains over the entire area. In other words, the portion of the electrode material film 411 sandwiched between the resist portion 412a and the resist portion 412b remains as well.

Figure 14D:
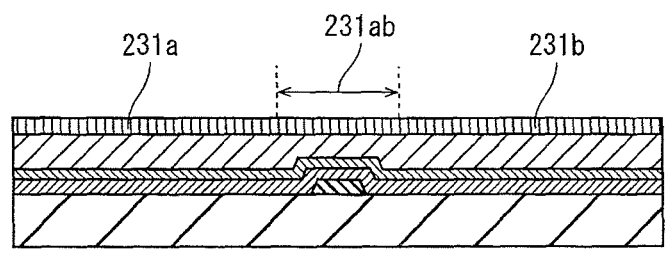

Next, the resist portions 412a, the resist portion 412 and the resist portion 412ab are removed with an organic remover, for example. The etching is performed on the electrode material film 411 with the portions of the resist material corresponding to the pixel electrode 231a, the pixel electrode 231b and the connector 231ab coated with the resist material. Hence, as shown in FIG. 14D, the pixel electrode 231a, the pixel electrode 231b and the connector 231ab are integrated in one piece.

In addition, after the resist material 412ab is added with the dispenser 414, a step of shaping the added resist material 412ab (into a line shape) by removing unnecessary resist with laser may be performed. The connector can be shaped by this step.

As described above, according to the manufacturing method pertaining to Modification 1, when performing the etching on the electrode material film 411, the patterned resist layer is modified such that the pixel electrode 231a, the pixel electrode 231b and the connector 231ab will be integrated in one piece. This modification is performed in the existing step, namely, the resist modification step performed for detecting and repairing a break or the likes in the resist layer.

In other words, instead of additionally providing a step of forming the connector after performing the etching on the electrode material film 411, the patterned resist layer is modified in the existing step, namely the resist modification step. Thus, the connector 231ab is formed at the same time as the pixel electrode 231a and the pixel electrode 231b are formed.

Since it is unnecessary to add a separate step of forming the connector, the structure in which adjacent pixel electrodes are integrated in one piece can be realized by such a simple manufacturing procedure.

Also, with the manufacturing method pertaining to Modification 1, since the resist modification is performed after the resist patterning, it is unnecessary to prepare an exposure mask corresponding in position to the faulty thin-film transistor element. The manufacturing method is therefore advantageous in terms of cost.

<Modification 2>

The following explains a modification example in which the shape of the pixel electrodes corresponding to faulty drive units is altered. In Modification 2, the patterned resist layer is modified in the resist modification step, as with Modification 1. In this step, the shape of the pixel electrodes corresponding to the faulty drive units is altered. In this modification, the arrangement of the gate line 200, the data line 201, the power line 202 and the drive unit 209 in the display panel is the same as shown in FIG. 2.

—Arrangement of Pixel Electrodes in Display Panel—

Figure 15:
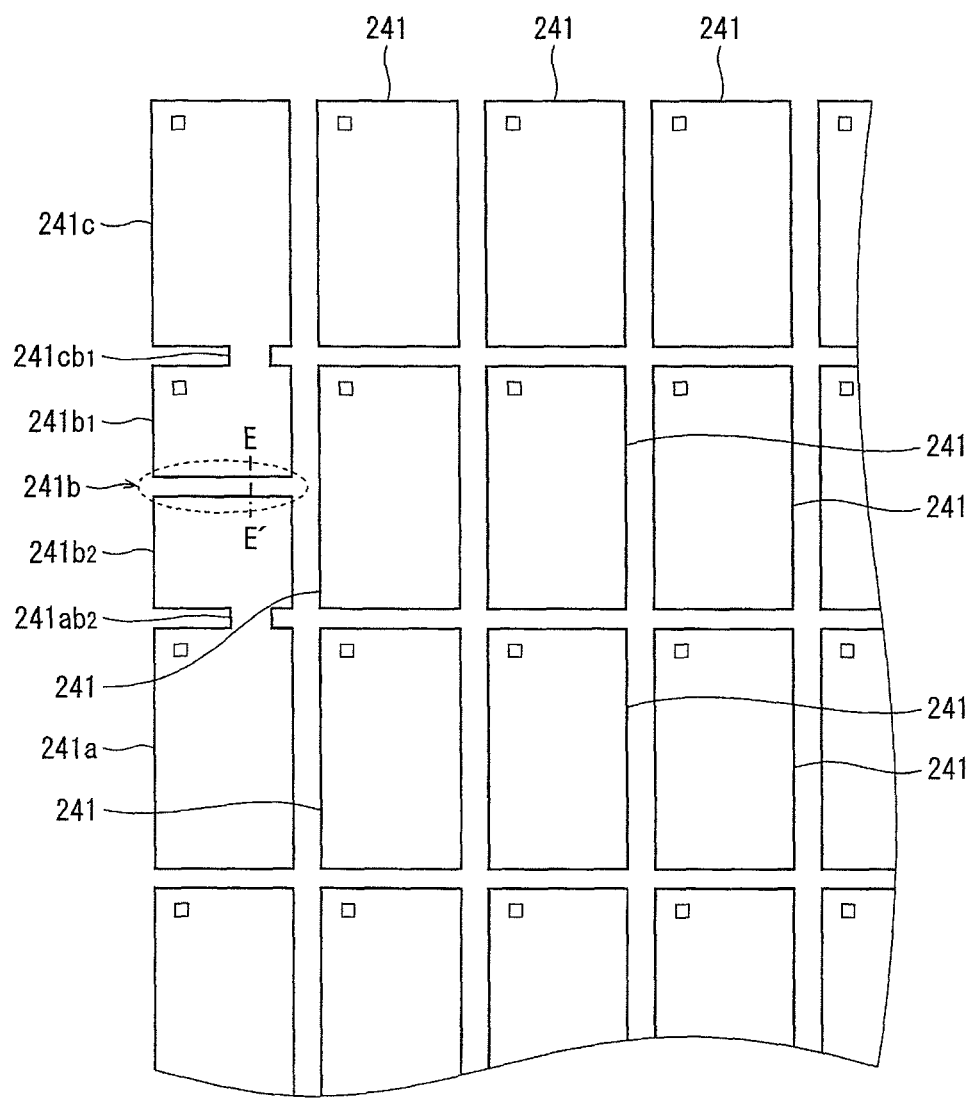
FIG. 15 is a schematic plan view showing pixel electrodes included in a display panel pertaining to Modification 2.

FIG. 15 is a schematic plan view showing pixel electrodes included in a display panel pertaining to Modification 2. As shown in FIG. 15, the pixel electrodes 241 are arranged in a matrix. The pixel electrodes 241 are provided in one-to-one correspondence with the drive units 209 shown in FIG. 2. Therefore, as with the structure shown in FIG. 3, the pixel electrodes 241 include pixel electrodes (second pixel electrodes) that correspond one-to-one to drive units that are not faulty, and pixel electrodes (first pixel electrodes) that correspond one-to-one to drive units that are faulty. The following explanation focuses on a pixel electrode 241a, a pixel electrode 241b, and a pixel electrode 241c. In FIG. 15, the pixel electrode 241a and the pixel electrode 241c represent the pixel electrodes corresponding to non-faulty drive units, and the pixel electrode 241b represents the pixel electrode corresponding to a faulty drive unit.

The difference from the structure shown in FIG. 3 is that the pixel electrode 241b is divided into parts, and each part is connected to a different pixel electrode. In this example, the pixel electrode 241b is divided into pixel electrode parts $241b_1$ and $241b_2$, and the pixel electrode part $241b_1$ is connected to the pixel electrode 241c via the connector $241cb_1$, and the pixel electrode part $241b_2$ is connected to the pixel electrode 241a via the connector $241ab_2$.

The wiring line extending from the drive transistor 204b to the power supply pad 211b in the drive unit 209b is cut, and the pixel electrode $241b_2$ is connected to the pixel electrode 241a and is driven by the drive unit 209a. That is, both pixel electrodes are driven by the drive unit 209a.

At the same time, the pixel electrode $241b_1$ is connected to the pixel electrode 241c and is driven by the non-faulty drive unit corresponding to the pixel electrode 241c. That is, both pixel electrodes are driven by the drive unit corresponding to the pixel electrode 241c.

With the stated structure, occurrence of dark dots and bright dots on the display panel is prevented from being caused by the faulty drive unit 209b, and degradation of the image quality is therefore prevented.

In addition, when the boundary between the pixel electrode 241a and the pixel electrode 241b corresponds to the boundary between images, since only the pixel electrode part $241b_2$, which is a portion of the pixel electrode 241b, is connected to the pixel electrode 241a, the stated structure reduces the user's uncomfortable feeling, in comparison with the case where the entire pixel electrode 241b is connected to the pixel electrode 241a.

—Manufacturing Procedures—

The following explains the manufacturing procedures for the display panel. FIGS. 16A through 16E constitute a process chart showing an example of part of a pixel electrode formation step pertaining to Modification 2 (corresponding to cross-section along E-E' in FIG. 15). FIGS. 17A through 17C constitute a process chart showing an example of part of the pixel electrode formation step, following the part shown in FIGS. 16A through 16E.

Figure 16A:
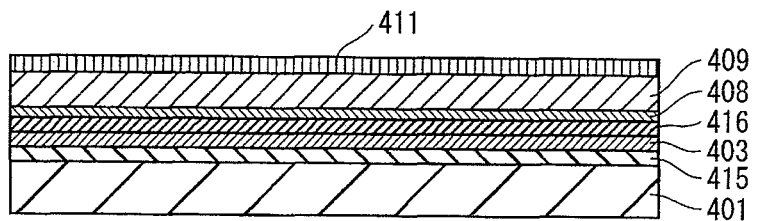
FIGS. 16A through 16E constitute a process chart showing an example of part of a pixel electrode formation step pertaining to Modification 2 (corresponding to cross-section along E-E' in FIG. 15).
Figure 17A:
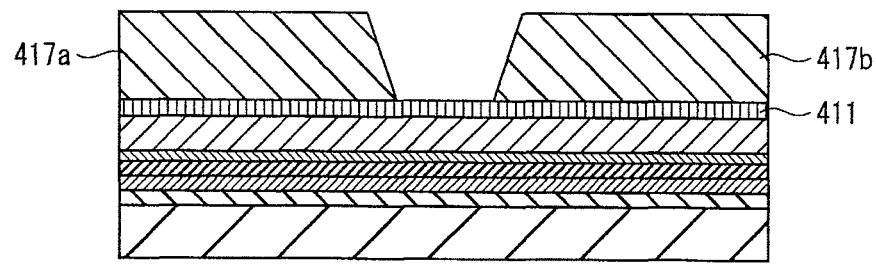
FIGS. 17A through 17C constitute a process chart showing an example of part of the pixel electrode formation step, following the part shown in FIGS. 16A through 16E.
Figure 17B:
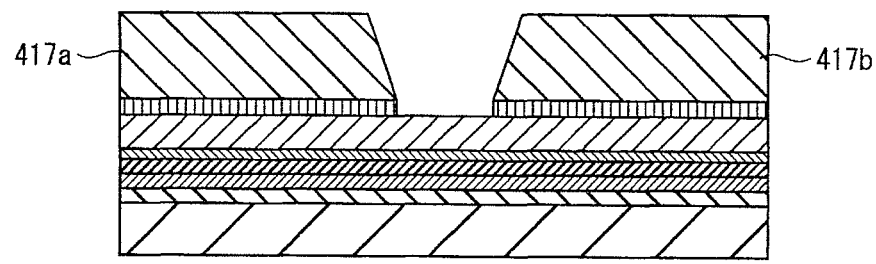
Figure 17C:
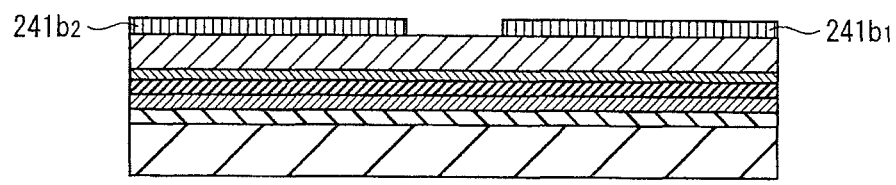

FIG. 16A shows that a first plate layer 415, a gate insulation film 403, a second plate layer 416, a passivation film 408, a planarizing film 409, and an electrode material film 411 are layered on the substrate 401 in this order.

Figure 16B:
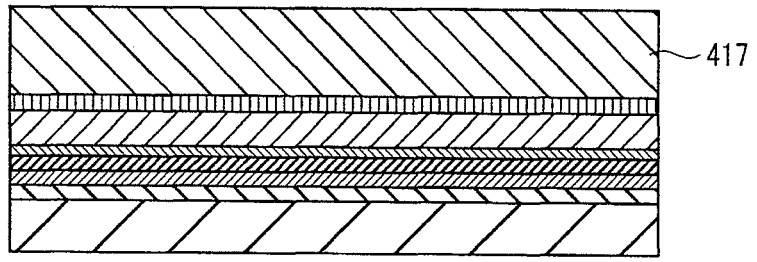
Figure 16C:
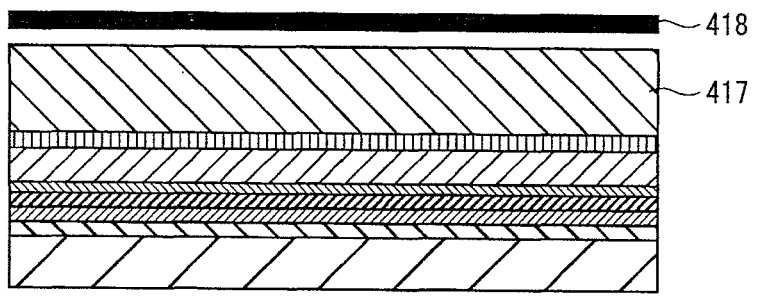
Figure 16D:
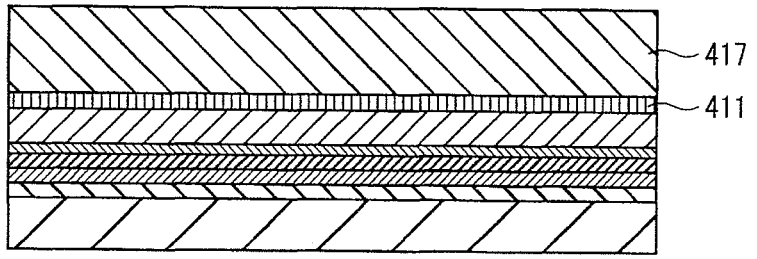

After that, as shown in FIG. 16B, a resist layer 417 is formed on the electrode material layer 411. Next, as shown in FIG. 16C, a mask 418 with apertures having a predetermined shape is layered on the resist layer 417. Then, the resist layer 417 is exposed to light from above the mask 418. The remaining resist is washed off by developer (e.g. TMAH (Tetra methyl ammonium hydroxide) aqueous solution). Patterning on the resist layer 417 thus completes. As shown in FIG. 16D, in the patterned resist layer 417 coats the entire surface of the electrode material film 411.

Figure 16E:
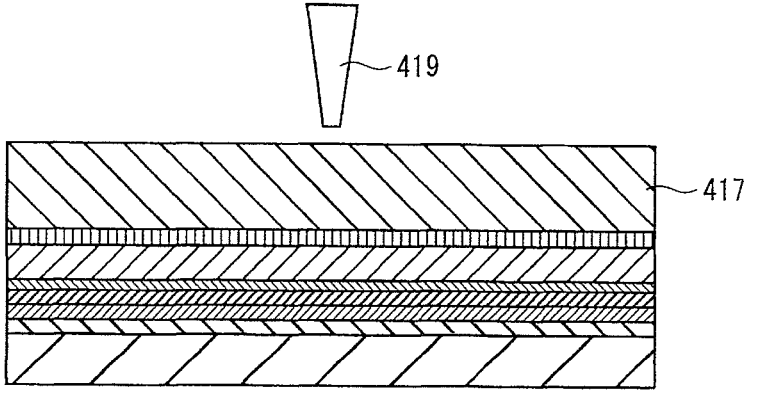

Next, as shown in FIG. 16E, the patterned resist layer is modified by removing part of the resist layer 417 by using laser 419. As a result, as shown in FIG. 17A, part of the electrode material film 411 is exposed from the gap between the resist portions 417a and 417b.

Next, wet etching is performed on the electrode material film 411 by using a wet etching solution. As a result, only the portions of the electrode material film 411 coated with the resist material will remain. As a result, as shown in FIG. 17B, only the part of the electrode material film 411 coated with the resist portions 417a and 417b will remain.

Next, the resist portion 417a and the resist portion 417b are removed with an organic remover, for example. As a result, the pixel electrode $241b_1$ and the pixel electrode $241b_2$ are formed as shown in FIG. 17C.

As described above, according to the manufacturing method pertaining to Modification 2, when performing the etching on the electrode material film, the patterned resist layer is modified such that the pixel electrode 241b will be divided into parts. This modification is performed in the existing step, namely, the resist modification step. In other words, the pixel electrode is divided into portions by modifying the patterned resist layer in the existing step, namely the resist modification step. Therefore, the structure in which pixel electrodes corresponding to faulty drive units are divided into parts can be realized without increasing the number of manufacturing steps.

Also, with the manufacturing method pertaining to Modification 2, since the resist modification is performed after the resist patterning, it is unnecessary to prepare an exposure mask corresponding in position to the faulty thin-film transistor element. The manufacturing method is therefore advantageous in terms of cost.

<Modification 3>

The following explains a modification example in which the shape of the pixel electrodes corresponding to faulty drive units is altered. In Modification 3, the patterned resist layer is modified in the resist modification step, as with Modifications 1 and 2. In this step, the shape of the pixel electrodes corresponding to the faulty drive units is altered. In this modification, the arrangement of the gate line 200, the data line 201, the power line 202 and the drive unit 209 in the display panel is the same as shown in FIG. 2.

—Arrangement of Pixel Electrodes in Display Panel—

Figure 18:
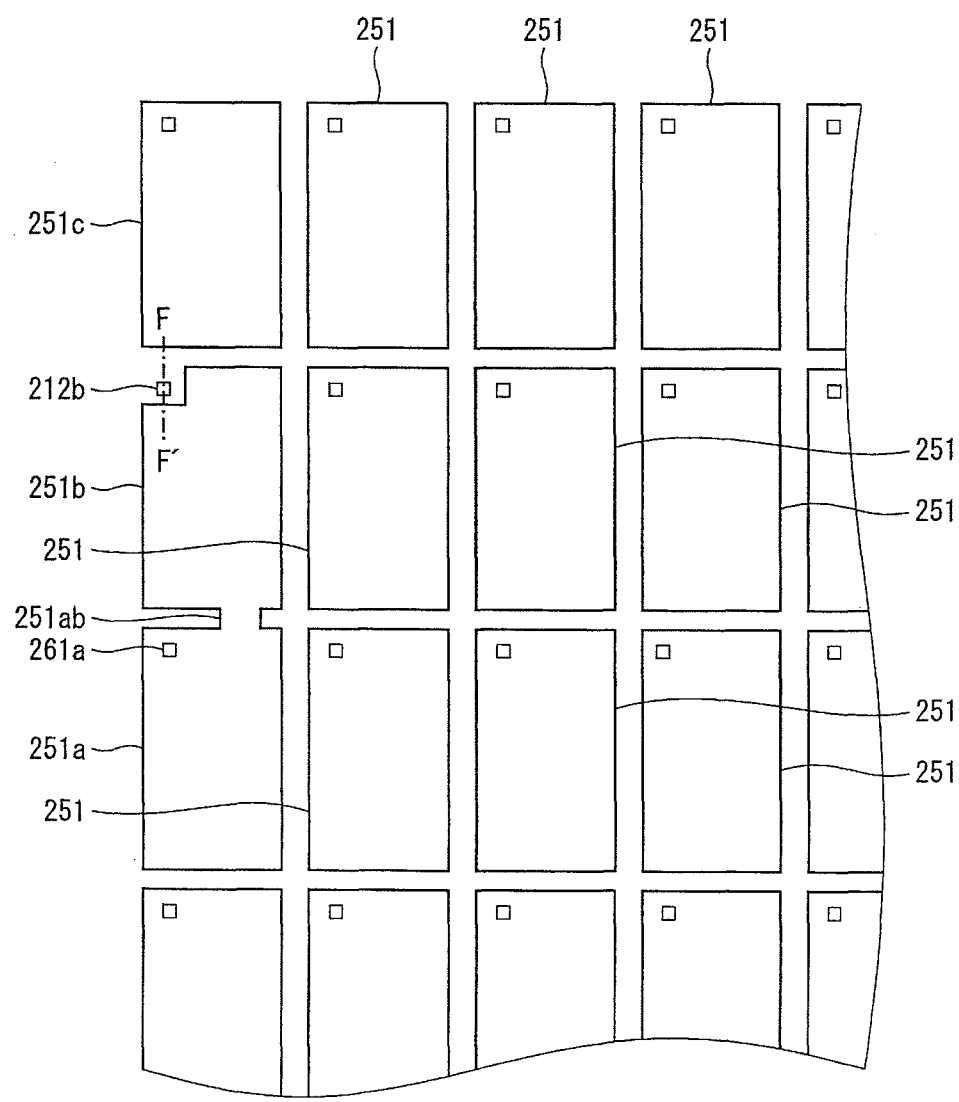
FIG. 18 is a schematic plan view showing pixel electrodes included in a display panel pertaining to Modification 3.

FIG. 18 is a schematic plan view showing pixel electrodes included in a display panel pertaining to Modification 3. As shown in FIG. 18, the pixel electrodes 251 are arranged in a matrix. The pixel electrodes 251 are provided in one-to-one correspondence with the drive units 209 shown in FIG. 2. Therefore, as with the structure shown in FIG. 3, the pixel electrodes 251 include pixel electrodes (second pixel electrodes) that correspond one-to-one to drive units that are not faulty, and pixel electrodes (first pixel electrodes) that correspond one-to-one to drive units that are faulty. In FIG. 18, the pixel electrode 251a represents the pixel electrode corresponding to the drive unit 209a, and the pixel electrode 251b represents the pixel electrode corresponding to the drive unit 209b.

As with the structure shown in FIG. 18, the pixel electrode 251a and the pixel electrode 251b are connected via a connector 251ab made of conductive material. The pixel electrode 251a, the pixel electrode 251b and the connector 251ab may be integrated in one piece.

The wiring line extending from the drive transistor 204b to the power supply pad 211b in the drive unit 209b is cut, and the pixel electrode 251b is connected to the pixel electrode 251a and is driven by the drive unit 209a. That is, both pixel electrodes are driven by the drive unit 209a.

With the stated structure, occurrence of dark dots and bright dots on the display panel is prevented from being caused by the faulty drive unit 209b, and degradation of the image quality is therefore prevented.

In FIG. 18, the difference from the structures shown in FIG. 3 and FIG. 10 is that the contact hole 212b corresponding to the pixel electrode 251b is not coated with the pixel electrode 251b. That is, in the present Modification, the pixel electrode 251b does not cover the contact hole 212b, where as the pixel electrode 251a covers the contact hole 261a (i.e. part of the pixel electrode 251a is embedded in the contact hole). Thus, the pixel electrode 251b is not formed on the area corresponding to the contact hole 212b.

As described above, the pixel electrode 251b is electrically insulated from the faulty drive unit 209b by altering the shape of the pixel electrode 251b.

—Manufacturing Procedures—

The following explains the manufacturing procedures for the display panel.

Figure 19:
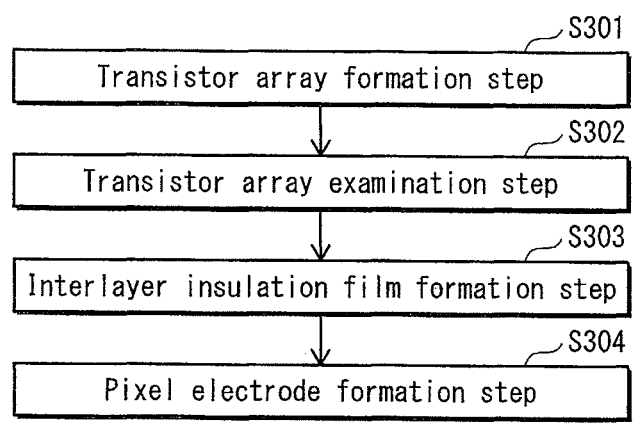
FIG. 19 is a diagram showing steps for manufacturing the display panel pertaining to Modification 3.

FIG. 19 is a diagram showing steps for manufacturing the display panel pertaining to Modification 3.

Steps S301 and S302 in FIG. 19 are the same as Steps S101 and S102 in FIG. 6. Hence, descriptions thereof are omitted.

In the present Modification, after the transistor array examination of Step S302, the interlayer insulation film formation in Step S303 is performed without performing a step of cutting a wiring line.

After that, in the pixel electrode formation in Step S304, pixel electrodes are formed in matrix so as to correspond one-to-one to the drive units. As described above, the pixel electrode formation step includes the resist modification step. In the present Modification, the portion of the patterned resist layer corresponding to the contact hole 212b is removed in the resist modification step. The pixel electrode formation step is explained below in detail, with reference to FIGS. 20A through 20D and FIGS. 21A through 21D. FIGS. 20A through 20D constitute a process chart showing an example of part of a pixel electrode formation step pertaining to Modification 3 (corresponding to cross-section along F-F' in FIG. 19). FIGS. 21A through 21D constitute a process chart showing an example of part of the pixel electrode formation step, following the part shown in FIGS. 20A through 20D.

Figure 20A:
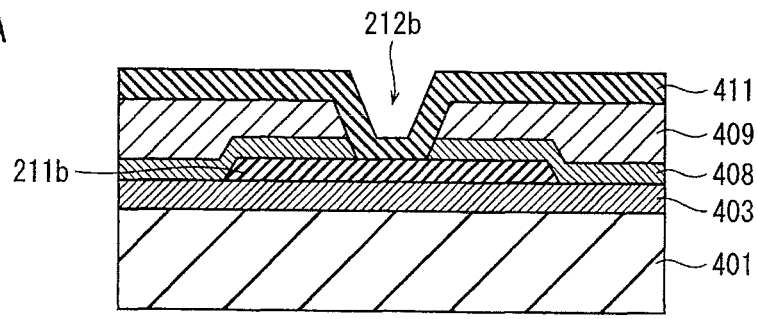
FIGS. 20A through 20D constitute a process chart showing an example of part of a pixel electrode formation step pertaining to Modification 3 (corresponding to cross-section along F-F' in FIG. 18).

FIG. 20A shows that a gate insulation film 403, a power supply pad 211b, a passivation film 408, a planarizing film 409 and an electrode material film 411 are layered on the substrate 401 in this order. Note that a contact hole 212b is provided in the passivation film 408 and the planarizing film 409 above the power supply pad 211b. The electrode material film 411 is formed on the planarizing film 409 so as to coat the inside surface of the contact hole 212b.

Figure 20B:
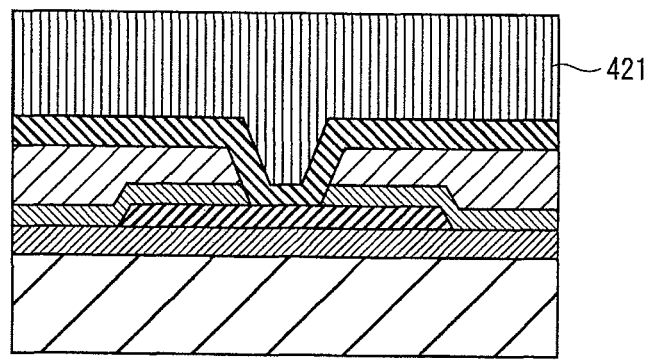
Figure 20C:
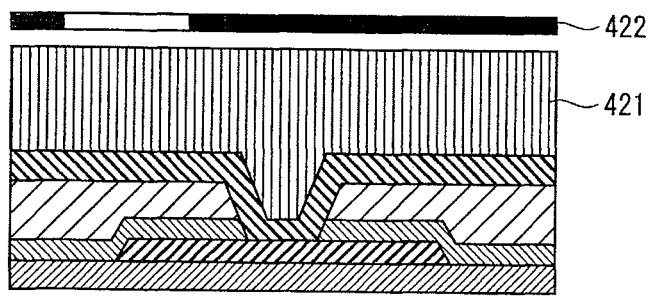
Figure 20D:
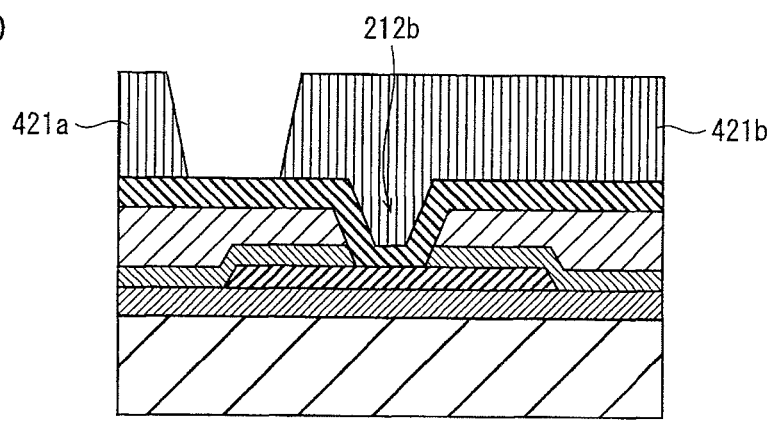

After that, as shown in FIG. 20B, a resist layer 421 is formed on the electrode material layer 411. Next, as shown in FIG. 20C, a mask 422 with apertures having a predetermined shape is layered on the resist layer 421. Then, the resist layer 421 is exposed to light from above the mask 422. The remaining resist is washed off by developer (e.g. TMAH (Tetra methyl ammonium hydroxide) aqueous solution). Patterning on the resist layer 421 thus completes. As shown in FIG. 20D, in the patterned resist layer 412, the portion that is out of alignment with the contact hole 212b (the portion corresponding to the gap between the pixel electrode 251b and the pixel electrode 251c) has been removed. Thus, the resist layer 421 consists of a resist portion 421a and a resist portion 421b.

Figure 21A:
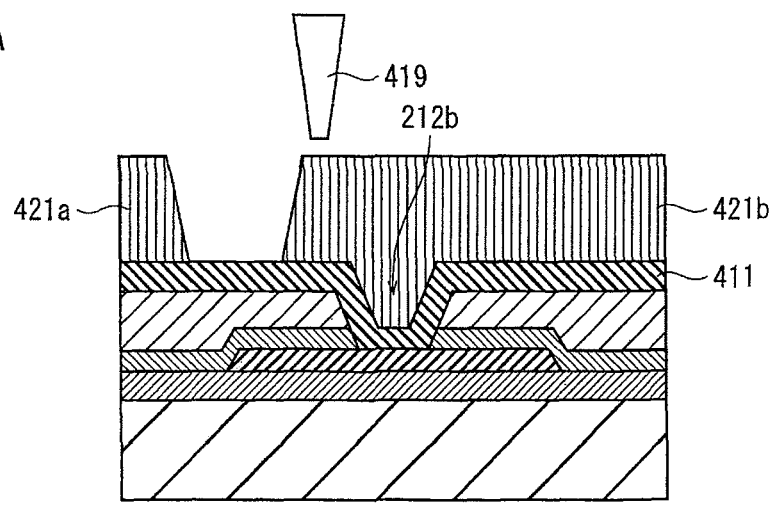
FIGS. 21A through 21D constitute a process chart showing an example of part of the pixel electrode formation step, following the part shown in FIGS. 20A through 20D.
Figure 21B:
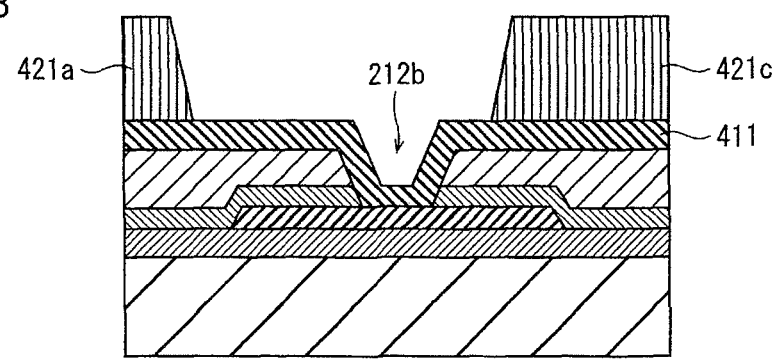

Next, as shown in FIG. 21A, the portion of the resist portion 421b above the contact hole 212b is irradiated with laser 419 to remove the portion as shown in FIG. 21B, by which the portion of the electrode material film 411 corresponding to the contact hole 212b is exposed.

Figure 21C:
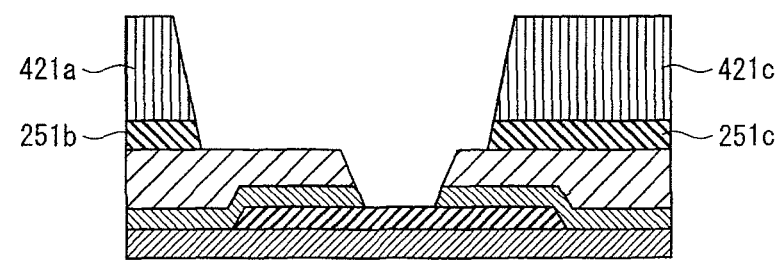
Figure 21D:
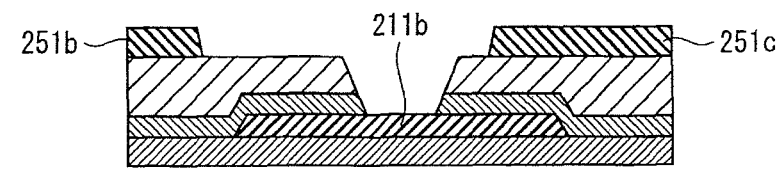

Next, wet etching is performed on the electrode material film 411 by using a wet etching solution. As a result, only the portions of the electrode material film 411 coated with the resist material will remain. As shown in FIG. 21B, the portion of the electrode material film 411 corresponding to the contact hole 212b is not coated with the resist portion 421c. Hence, the portion of the electrode material film 411 will be removed as shown in FIG. 21C. Next, the resist portion 421a and the resist portion 421c are removed with an organic remover, for example. As a result, the pixel electrode 251a and the pixel electrode 251b are formed as shown in FIG. 21D. The pixel electrode 251b is not extended toward the contact hole 212b, and is not in contact with the power supply pad 211b. The pixel electrode 251b is therefore electrically insulated from the power supply pad 211b.

As described above, according to the manufacturing method pertaining to Modification 3, when performing the etching on the electrode material film 211, the patterned resist layer is modified such that the pixel electrode 251b will not be formed on the area corresponding to the contact hole. Faulty drive units are electrically insulated from pixel electrodes by modifying the patterned resist layer in the existing step, namely the resist modification step, instead of adding a separate step of cutting a wiring line. Hence, the manufacturing procedure can be simplified.

In addition, since faulty drive units are electrically insulated from the pixel electrodes by modifying the patterned resist layer, it is unnecessary to alter the arrangement of the thin-film transistor elements.

Although not particularly described above, the pixel electrode 251a, the pixel electrode 251b and the connector 251ab may be integrated in one piece by adding a resist material to the gap between adjacent pixel electrodes as shown in FIG. 14A and FIG. 14B. If this is the case, the pixel electrode 251a, the pixel electrode 251b and the connector 251ab may be integrated in one piece while insulating faulty drive units are insulated from pixel electrodes, without adding any step.

Also, with the manufacturing method pertaining to Modification 3, since it is unnecessary to prepare an exposure mask corresponding in position to the faulty thin-film transistor element, as with the case of Modifications 1 and 2. This manufacturing method is therefore advantageous in terms of cost.

Although the above description is based on the assumption that the pixel electrode 251b is not formed on the area corresponding to the contact hole (i.e., the pixel electrode 251b is not embedded in the contact hole), the pixel electrode 251b may be partially embedded in the contact hole as long as it is not in contact with the power supply pad 211b.

<Modification 4>

The following explains a modification example in which the structure of each drive unit is altered. In this modification example, each drive unit includes a single thin-film transistor element.

—Layout—

Figure 22:
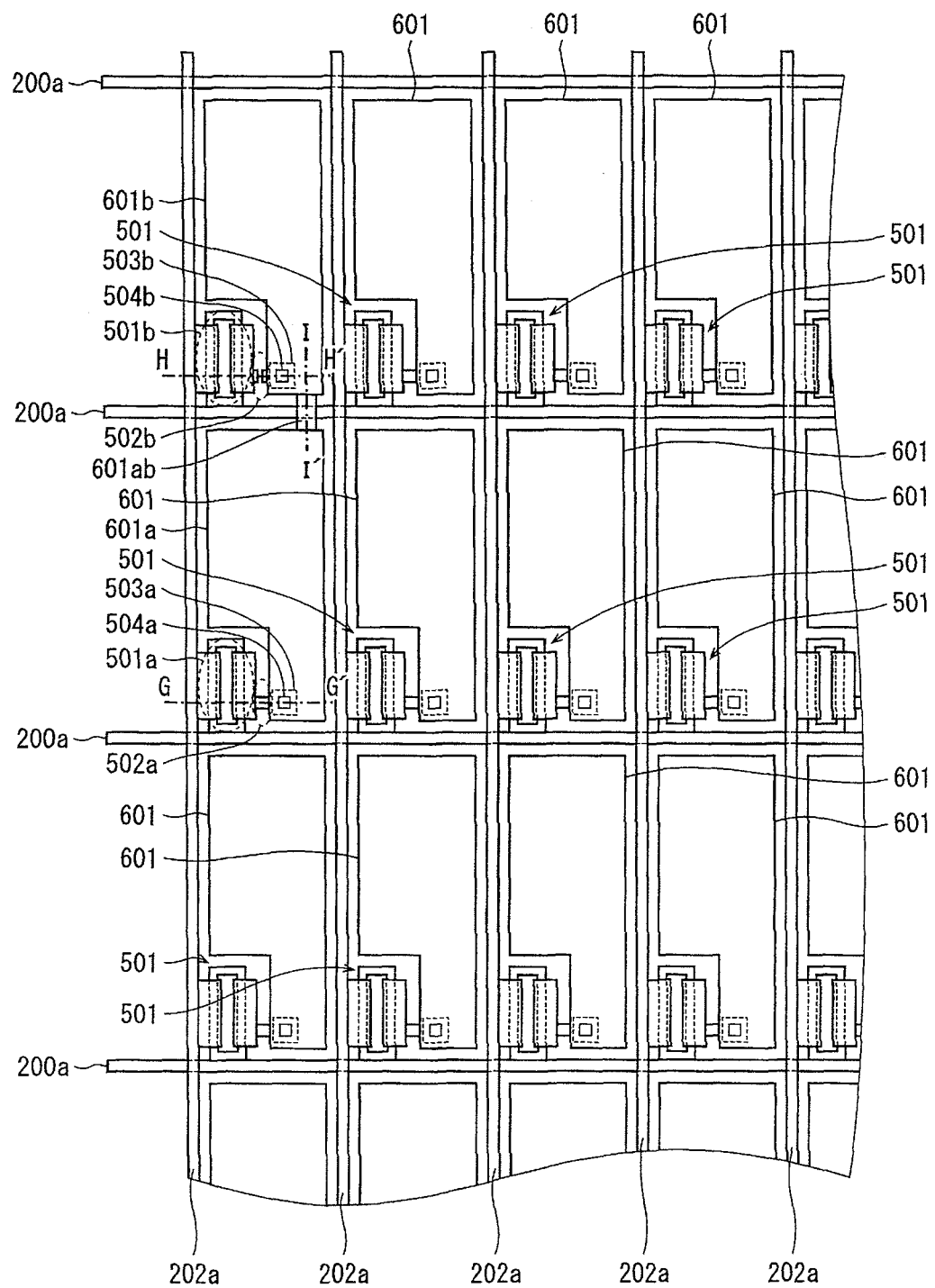
FIG. 22 is a schematic plan view showing an arrangement of gate lines 200a, power lines 202a, drive units 501 and pixel electrodes 601 included in a display panel pertaining to Modification 4.

The following explains the arrangement of gate lines 200a, power lines 202a, drive units 501 and pixel electrodes 601 included in a display panel pertaining to Modification 4. FIG. 22 is a schematic plan view showing the arrangement of the gate lines 200a, the power lines 202a, the drive units 501 and the pixel electrodes 601 included in the display panel pertaining to Modification 4.

As shown in FIG. 22, the drive units 501 are arranged in a matrix. Some of the drive units 501 are assumed to be faulty, and the others are assumed to be not faulty. The pixel electrodes 601 are arranged in a matrix so as to correspond one-to-one to the drive units 501. The pixel electrodes 601 therefore include pixel electrodes (second pixel electrodes) that correspond one-to-one to drive units that are not faulty, and pixel electrodes (first pixel electrodes) that correspond one-to-one to drive units that are faulty. The following explanation focuses on the drive unit 501a, the drive unit 501b, the pixel electrode 601a and the pixel electrode 601b. In FIG. 9, the drive unit 501a represents a drive unit that is not faulty, and the drive unit 501b represents a drive unit that is faulty. Also, the pixel electrode 601a represents a pixel electrode corresponding to the drive unit 501a, and the pixel electrode 601b represents a pixel electrode corresponding to the drive unit 502b.

The non-faulty drive unit 501a and a power supply pad 503a for supplying power to the pixel electrode 601a are connected by a wiring line (see the dashed lines 502a). Thus, the drive unit 501a supplies power to the pixel electrode 601a connected to the power supply pad 503a via the contact hole 504a. In other words, the drive unit 501a is electrically connected to the pixel electrode 601a.

In contrast, the wiring line connecting the faulty drive unit 501b and the power supply pad 503b for supplying power to the pixel electrode 601b is cut (see the dashed lines 502b). Thus, the drive unit 501b does not supply power to the pixel electrode 601b connected to the power supply pad 503b via a contact hole 504b. In other words, the faulty drive unit 501b is electrically insulated from the pixel electrode 601b.

The pixel electrode 601a and the pixel electrode 601b are connected via a connector 601ab made of conductive material.

As described above, the wiring line extending from the drive unit 501b to the power supply pad 503b is cut, and the pixel electrode 601b is connected to the pixel electrode 601a and is driven by the drive unit 501a. That is, both pixel electrodes are driven by the drive unit 501a.

Accordingly, occurrence of dark dots and bright dots on the display panel caused by the faulty drive unit 501b is prevented, and degradation of the image quality is therefore prevented.

A gate line 200a is provided along one side of each row consisting of a series of drive units. A power line 202a is provided along one side of each column consisting of a series of drive units.

—Cross-Sectional View—

Figure 23A:
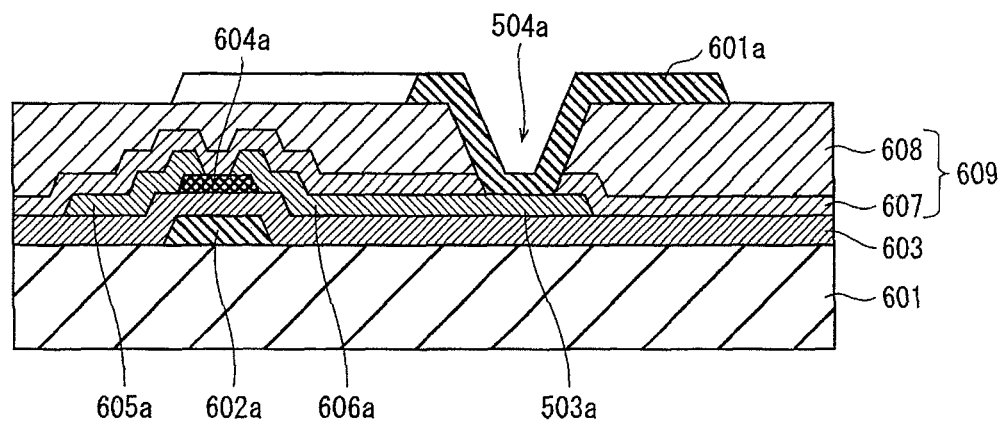
FIG. 23A is a partial cross-sectional view (cross-section along G-G' in FIG. 22) schematically showing the structure of the display panel pertaining to Modification 4.

FIG. 23A is a partial cross-sectional view (cross-section along G-G' in FIG. 22) schematically showing the structure of the display panel pertaining to Modification 4. As shown in FIG. 23A, a gate electrode 602a is disposed on a substrate 601, and a gate insulation film 603 is formed on the substrate 601 on which the gate electrode 602a has been disposed. A semiconductor layer 604a is formed on the portion of the gate insulation film 603 above the gate electrode 602a. In addition, SD electrode wiring lines 605b and 606b and a power supply pad 503a are disposed on the gate insulation film 603. Each of the SD electrode wiring lines 605a and 606a partially overlaps the semiconductor layer 604a. The SD electrode wiring lines 605a and 606a have a gap therebetween, and the gap is located above the semiconductor layer 604a. Furthermore, an interlayer insulation film 607 is formed to coat the SD electrode wiring lines 605a and 406a and the power supply pad 503a. The interlayer insulation film 609 has a two-layer structure, for example, and is composed of a passivation film 607 and a planarizing film 608. A contact hole 504a is formed in the interlayer insulation film 609, and a pixel electrode 601a is formed to coat the inside surface of the contact hole 504a so as to have contact with the power supply pad 503a.

Figure 23B:
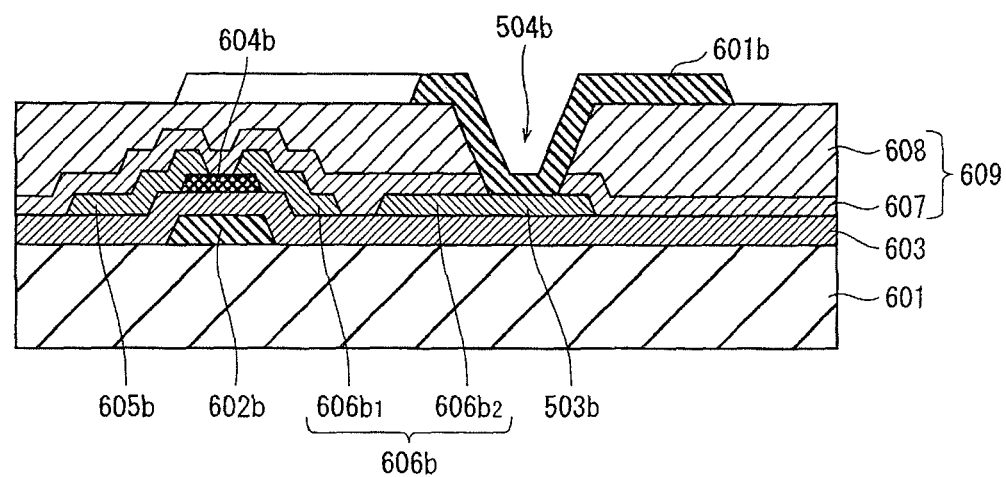
FIG. 23B is a partial cross-sectional view (cross-section along H-H' in FIG. 22) schematically showing the structure of the display panel pertaining to Modifications 4.

FIG. 23B is a partial cross-sectional view (cross-section along H-H' in FIG. 22) schematically showing the structure of the display panel pertaining to Modification 4. As shown in FIG. 23B, a gate electrode 602b is disposed on the substrate 601, and the gate insulation film 603 is formed on the substrate 601 on which the gate electrode 602b has been disposed. A semiconductor layer 604b is formed on the portion of the gate insulation film 603 above the gate electrode 602b. In addition, SD electrode wiring lines 605b and 606b and a power supply pad 503b are disposed on the gate insulation film 603. Each of the SD electrode wiring lines 605b and 606b partially overlaps the semiconductor layer 604b. The SD electrode wiring lines 405b and 406b have a gap therebetween, and the gap is located above the semiconductor layer 604b.

Note that FIG. 23B is different from FIG. 23A in that the SD electrode wiring line 606b is cut off. That is, the SD electrode wiring line 606b is composed of an electrode part $606b_1$ and an electrode part $606b_2$, and there is a gap between them. Therefore, no power can be provided from the faulty drive unit 501b to the pixel electrode 601b.

Furthermore, an interlayer insulation film 609 is formed to coat the SD electrode wiring lines 605b and 606b and the power supply pad 503b. The interlayer insulation film 609 has a two-layer structure, for example, and is composed of a passivation film 607 and a planarizing film 608. A contact hole 504a is formed in the interlayer insulation film 609, and a pixel electrode 601a is formed to coat the inside surface of the contact hole 504a so as to have contact with the power supply pad 503b.

The cross-section along the I-I' line in FIG. 22 is the same as the cross-section shown in FIG. 5. In brief, the pixel electrode 601a and the pixel electrode 601b are disposed on the planarizing film with a gap therebetween, and a connector 601ab is formed to connect these pixel electrodes. The connector 601ab is a metal thin film. On the area between the pixel electrode 601a and the pixel electrode 601b where the connector 601ab is formed, the surface of the connector 601ab facing the planarizing film 409 is entirely in contact with the planarizing film 409. Hence, the connector 601ab is unlikely to break.

Also, the gate line 200a and the connector 601ab face each other with a thick film interposed therebetween. One example of the thick film is a planarizing film 608 in which pin holes are unlikely to occur. Accordingly, short circuit between the gate line 200a and the connector 601ab is prevented.

Moreover, since the planarizing film 409 is a thick film, the gap between the gate line 200a and the connector 601ab is relatively wide. Therefore, the parasitic capacitance is small. Such a structure prevents degradation of the image quality due to delay in video signal transmission or cross-talk.

Note that the Modifications 1-3 may be combined with the present modification.

<Other Modifications>

(1) When the display panel is an organic EL display panel, a hole-injection layer, a hole transporting layer, or a layer serving as both of the hole-injection layer and the hole transporting layer may be inserted between the pixel electrode and the organic light-emitting layer, according to needs. A hole-injection layer, a hole transporting layer, or a layer serving as both of the hole-injection layer and the hole transporting layer may be inserted between the common electrode and the organic light-emitting layer, according to needs.

(2) In this section, the structure of a liquid crystal display panel as an example of the display panel is explained. In a liquid crystal display panel, a passivation film is formed on a transistor array substrate, and a planarizing film is formed on the passivation film. A plurality of pixel electrodes are formed on the planarizing film. The structure in terms of the points mentioned above is the same as the EL display panel. The difference from the EL display panel is that a common electrode is disposed to face the pixel electrodes, and the gap between the pixel electrodes and the common electrode is filled with a liquid crystal.

(3) In the present Description, "matrix" is a concept including a honeycomb structure. Hence, "adjacent pixel electrodes" are not necessarily adjacent in the row and column directions, and may be adjacent in oblique directions. Therefore, a faulty pixel electrode may be connected to the pixel electrode that is adjacent to the faulty pixel electrode in an oblique direction.

(4) Although a pixel electrode corresponding to a faulty drive unit is connected to the pixel electrode that is adjacent thereto in the column direction, it may be connected to the pixel electrode that is adjacent thereto in the row direction. In particular, when the display panel is a panel for displaying a single color, the faulty pixel electrode is not necessarily connected to the adjacent pixel electrode in the column direction.

(5) The interlayer insulation film 407 may be composed only of a passivation film. If this is the case, it is necessary that at least the area between the pixel electrode 205*a* and the pixel electrode 205*b* is flat so as to prevent occurrence of breaks in the connector 205*ab*. The same applies to the modifications described above.

(6) Each of the pixel electrodes is composed of a portion formed on the interlayer insulation film and a portion embedded in the corresponding contact hole. These portions are not necessarily integrated in one piece, and they may be made of different materials.

(7) The external view of the display device 100 is as shown in FIG. 24, for example.

INDUSTRIAL APPLICABILITY

The present invention is applicable to, for example, display devices for home use, public use and industrial use, television devices, and display panels for portable electronic devices.

REFERENCE SIGNS LIST

100 display device
101 control circuit
102 memory
103 scanning line drive circuit
104 data line drive circuit
105 display panel
200 gate line
201 data line
202 power line
203 switching transistor
204 drive transistor
205 pixel electrode
206 capacitor
207 common electrode
208 pixel circuit
209 drive unit

The invention claimed is:

1. A display panel, comprising:
   a transistor array substrate having a plurality of drivers arranged in a matrix, each driver including a thin-film transistor element;
   an interlayer insulation film formed on the transistor array substrate and having contact holes, the contact holes corresponding one-to-one to the drivers; and
   a plurality of pixel electrodes arranged on the interlayer insulation film in a matrix, the pixel electrodes corresponding one-to-one to the drivers, wherein
   the drivers include faulty drivers and non-faulty drivers,
   the pixel electrodes include first pixel electrodes and second pixel electrodes, the first pixel electrodes corresponding one-to-one to the faulty drivers, and the second pixel electrodes corresponding one-to-one to the non-faulty drivers,
   a portion of each second pixel electrode is embedded in the contact hole corresponding thereto, and is in contact with a power supply pad of the non-faulty driver corresponding thereto, so that the second pixel electrode is electrically connected to the non-faulty driver,
   each first pixel electrode is electrically insulated from the faulty driver corresponding thereto,
   each first pixel electrode is connected by a connector to any of the second pixel electrodes adjacent thereto, the connector being made of conductive material,
   a surface of each connector facing the interlayer insulation film is entirely in contact with the interlayer insulation film, and
   at least one of the first pixel electrodes is divided into parts, and each part is connected to a different one of the second pixel electrodes adjacent to the at least one of the first pixel electrodes.

2. The display panel of claim 1, wherein
   the pixel electrodes and the connectors are made of a same material, and
   the first pixel electrodes, the second pixel electrodes, and the connectors are integrated in one piece.

3. The display panel of claim 2, wherein
   the first pixel electrodes, the second pixel electrodes, and the connectors are integrated in one piece by etching an electrode material film having portions coated with resist material, the portions corresponding to the pixel electrodes and the connectors.

4. The display panel of claim 1, wherein
   a power supply path to each first pixel electrode is cut off so that the first pixel electrode is electrically insulated from the faulty driver corresponding thereto, the power supply path being included in the thin-film transistor element of the driver corresponding to the first pixel electrode.

5. The display panel of claim 1, wherein
   each first pixel electrode is formed so as not to cover the contact hole corresponding thereto.

6. A display panel, comprising:
   a transistor array substrate having a plurality of drivers arranged in a matrix, each driver including a thin-film transistor element;

an interlayer insulation film formed on the transistor array substrate and having contact holes, the contact holes corresponding one-to-one to the drivers; and a plurality of pixel electrodes arranged on the interlayer insulation film in a matrix, the pixel electrodes corresponding one-to-one to the drivers, wherein the drivers include faulty drivers and a non-faulty drivers, the pixel electrodes include first pixel electrodes and second pixel electrodes, the first pixel electrodes corresponding one-to-one to the faulty drivers, and the second pixel electrodes corresponding one-to-one to the non-faulty drivers, a portion of each second pixel electrode is embedded in the contact hole corresponding thereto, and is in contact with a power supply pad of the non-faulty driver corresponding thereto, so that the second pixel electrode is electrically connected to the non-faulty driver, each first pixel electrode is electrically insulated from the faulty driver corresponding thereto, each first pixel electrode is connected by a connector to any of the second pixel electrodes adjacent thereto, the connector being made of conductive material, a surface of each connector facing the interlayer insulation film is entirely in contact with the interlayer insulation film, and each first pixel electrode is formed so as not to cover the contact hole corresponding thereto.

7. The display panel of claim 6, wherein
the pixel electrodes and the connectors are made of a same material, and
the first pixel electrodes, the second pixel electrodes, and the connectors are integrated in one piece.

8. The display panel of claim 7, wherein
the first pixel electrodes, the second pixel electrodes, and the connectors are integrated in one piece by etching an electrode material film having portions coated with resist material, the portions corresponding to the pixel electrodes and the connectors.

9. A method of manufacturing a display panel, comprising:
preparing a substrate;
forming a transistor array substrate by arranging drivers on the substrate in a matrix, each driver including a thin-film transistor element;
forming an interlayer insulation film on the transistor array substrate, the interlayer insulation film having contact holes, the contact holes corresponding one-to-one to the drivers; and
arranging a plurality of pixel electrodes on the interlayer insulation film in a matrix, the pixel electrodes corresponding one-to-one to the drivers, wherein
the drivers include faulty drivers and non-faulty drivers,
the pixel electrodes include first pixel electrodes and second pixel electrodes, the first pixel electrodes corresponding one-to-one to the faulty drivers, and the second pixel electrodes corresponding one-to-one to the non-faulty drivers,
a portion of each second pixel electrode is embedded in the contact hole corresponding thereto, and is in contact with a power supply pad of the non-faulty driver corresponding thereto, so that the second pixel electrode is electrically connected to the non-faulty driver,
each first pixel electrode is electrically insulated from the faulty driver corresponding thereto,
each first pixel electrode is connected by a connector to any of the second pixel electrodes adjacent thereto, the connector being made of conductive material, and a surface of each connector facing the interlayer insulation film is entirely in contact with the interlayer insulation film, the connectors are formed by using a same material as the pixel electrodes, the arranging of the pixel electrodes includes:
forming an electrode material film on the interlayer insulation film;
forming a resist film on the electrode material film;
patterning the resist film into portions corresponding in shape to the pixel electrodes;
adding resist material to any of the portions of the resist film located between each first pixel electrode and any of the second pixel electrodes adjacent thereto, thereby filling a gap between each first pixel electrode and any of the second pixel electrodes adjacent thereto;
removing a portion of the resist film corresponding to a central portion of at least one of the first pixel electrodes by using laser; and
integrally forming the first pixel electrodes, the second pixel electrodes, and the connectors in one piece by etching the electrode material film after the removing of the portion of the resist film, the resist material is added to portions of the resist film corresponding to gaps between the at least one first pixel electrode and two of the second pixel electrodes adjacent thereto, thereby filling the gaps with the resist material, and the at least one first pixel electrode is divided into parts, and each part of the first pixel electrode is connected to a different one of the second pixel electrodes adjacent thereto.

10. The method of claim 9, further comprising:
cutting off a power supply path to each first pixel electrode before the interlayer insulative film is formed, so that the first pixel electrode is electrically insulated from the faulty driver corresponding thereto, the power supply path being included in the thin-film transistor element of the driver corresponding to the first pixel electrode.

11. A method of manufacturing a display panel, comprising:
preparing a substrate;
forming a transistor array substrate by arranging drivers on the substrate in a matrix, each driver including a thin-film transistor element;
forming an interlayer insulation film on the transistor array substrate, the interlayer insulation film having contact holes, the contact holes corresponding one-to-one to the drivers; and
arranging a plurality of pixel electrodes on the interlayer insulation film in a matrix, the pixel electrodes corresponding one-to-one to the drivers, wherein
the drivers include faulty drivers and non-faulty drivers,
the pixel electrodes include first pixel electrodes and second pixel electrodes, the first pixel electrodes corresponding one-to-one to the faulty drivers, and the second pixel electrodes corresponding one-to-one to the non-faulty drivers,
a portion of each second pixel electrode is embedded in the contact hole corresponding thereto, and is in contact with a power supply pad of the non-faulty driver corresponding thereto, so that the second pixel electrode is electrically connected to the non-faulty driver,
each first pixel electrode is electrically insulated from the faulty driver corresponding thereto, each first pixel electrode is connected by a connector to any of the second pixel electrodes adjacent thereto, the connector being made of conductive material, a surface of each connector facing the interlayer insulation film is entirely in contact with the interlayer insulation film, the connectors are formed by using a same material as the pixel electrodes, the arranging of the pixel electrodes includes:
- forming an electrode material film on the interlayer insulation film;
- forming a resist film on the electrode material film;
- patterning the resist film into portions corresponding in shape to the pixel electrodes;
- adding resist material to any of the portions of the resist film located between each first pixel electrode and any of the second pixel electrodes adjacent thereto, thereby filling a gap between each first pixel electrode and any of the second pixel electrodes adjacent thereto;
- removing portions of the resist film corresponding to the contact holes corresponding to the first pixel electrodes by using laser; and
- integrally forming the first pixel electrodes, the second pixel electrodes, and the connectors in one piece by etching the electrode material film after the removing of the portions of the resist film, and each first pixel electrode is formed so as not to cover the contact hole corresponding thereto.

12. A method of manufacturing a display panel, comprising:
- preparing a substrate;
- forming a transistor array substrate by arranging drivers on the substrate in a matrix, each driver including a thin-film transistor element;
- detecting, from among the drivers arranged on the substrate, a faulty driver including a faulty thin-film transistor element;
- acquiring positional information of the faulty driver detected in the detecting;
- cutting off at least part of a wiring or a thin-film transistor element of the faulty driver indicated by the acquired positional information, so that the faulty driver is electrically insulated,
- forming an interlayer insulation film on the transistor array substrate, the interlayer insulation film having contact holes, the contact holes corresponding one-to-one to the drivers; and
- arranging a plurality of pixel electrodes on the interlayer insulation film in a matrix, the pixel electrodes corresponding one-to-one to the drivers, wherein the drivers include faulty drivers and non-faulty drivers, the pixel electrodes include first pixel electrodes and second pixel electrodes, the first pixel electrodes corresponding one-to-one to the faulty drivers, and the second pixel electrodes corresponding one-to-one to the non-faulty drivers, a portion of each second pixel electrode is embedded in the contact hole corresponding thereto, and is in contact with a power supply pad of the non-faulty driver corresponding thereto, so that the second pixel electrode is electrically connected to the non-faulty driver, each first pixel electrode is electrically insulated from the faulty driver corresponding thereto, the arranging of the pixel electrodes includes:
- forming an electrode material film on the interlayer insulation film;
- forming a resist film on the electrode material film;
- patterning the resist film into portions corresponding in shape to the pixel electrodes;
- adding resist material to any of the portions of the resist film located between each first pixel electrode and any of the second pixel electrodes adjacent thereto, thereby filling a gap between each first pixel electrode and any of the second pixel electrodes adjacent thereto;
- removing a portion of the resist film corresponding to a central portion of at least one of the first pixel electrodes by using laser; and
- integrally forming the first pixel electrodes, the second pixel electrodes, and the connectors in one piece by etching the electrode material film after the removing of the portion of the resist film, the resist material is added to portions of the resist film corresponding to gaps between the at least one first pixel electrode and two of the second pixel electrodes adjacent thereto, thereby filling the gaps with the resist material, and the at least one first pixel electrode is divided into parts, and each part of the first pixel electrode is connected to a different one of the second pixel electrodes adjacent thereto.

13. A method of manufacturing a display panel, comprising:
- preparing a substrate;
- forming a transistor array substrate by arranging drivers on the substrate in a matrix, each driver including a thin-film transistor element;
- detecting, from among the drivers arranged on the substrate, a faulty driver including a faulty thin-film transistor element;
- acquiring positional information of the faulty driver detected in the detecting;
- forming an interlayer insulation film on the transistor array substrate, the interlayer insulation film having contact holes, the contact holes corresponding one-to-one to the drivers; and
- arranging a plurality of pixel electrodes on the interlayer insulation film in a matrix, the pixel electrodes corresponding one-to-one to the drivers, wherein the drivers include faulty drivers and non-faulty drivers, and the pixel electrodes include first pixel electrodes and second pixel electrodes, the first pixel electrodes corresponding one-to-one to the faulty drivers, and the second pixel electrodes corresponding one-to-one to the non-faulty drivers, and the arranging of the pixel electrodes includes:
- forming an electrode material film on the interlayer insulation film;
- forming a resist film on the electrode material film;
- patterning the resist film into portions corresponding in shape to the pixel electrodes;
- adding resist material to any of the portions of the resist film located between each first pixel electrode and any of the second pixel electrodes adjacent thereto, thereby filling a gap between each first pixel electrode and any of the second pixel electrodes adjacent thereto;
- removing portions of the resist film corresponding to the contact holes corresponding to the first pixel electrodes by using laser; and
- integrally forming the first pixel electrodes, the second pixel electrodes, and the connectors in one piece by etching the electrode material film, each first pixel electrode being formed so as not to cover the contact hole corresponding thereto.

* * * * *